United States Patent
MacKenzie et al.

(10) Patent No.: US 7,276,385 B1
(45) Date of Patent: Oct. 2, 2007

(54) METHODS OF LASER REPAIRING A CIRCUIT, COMPOSITIONS AND EQUIPMENT FOR SUCH METHODS, AND STRUCTURES FORMED FROM SUCH METHODS

(75) Inventors: J. Devin MacKenzie, San Mateo, CA (US); Ikuo Mori, San Jose, CA (US)

(73) Assignee: Kovio, Inc., Sunnyvale, CA (US)

( * ) Notice: Subject to any disclaimer, the term of this patent is extended or adjusted under 35 U.S.C. 154(b) by 549 days.

(21) Appl. No.: 10/722,255

(22) Filed: Nov. 24, 2003

(51) Int. Cl.
 *H01L 21/00* (2006.01)
(52) U.S. Cl. .................... 438/4; 438/584; 257/E21.596
(58) Field of Classification Search .................... 438/4, 438/584; 257/E21.596
See application file for complete search history.

(56) References Cited

U.S. PATENT DOCUMENTS

| | | | |
|---|---|---|---|
| 4,340,617 A | 7/1982 | Deutsch et al. | |
| 4,526,807 A | 7/1985 | Auerbach | |
| 4,933,204 A | 6/1990 | Warren, Jr. et al. | |
| 5,132,248 A | 7/1992 | Drummond et al. | |
| 5,164,565 A | 11/1992 | Addiego et al. | |
| 5,989,945 A | 11/1999 | Yudasaka et al. | |
| 6,261,850 B1 * | 7/2001 | Marsh | 438/4 |
| 6,277,169 B1 | 8/2001 | Hampden-Smith et al. | |
| 6,348,295 B1 | 2/2002 | Griffith et al. | |

(Continued)

FOREIGN PATENT DOCUMENTS

JP 7-267621 10/1995

OTHER PUBLICATIONS

Kolano Yano, Yutaka Kitsuno, Akira Sakawaki, and Kaiji Kawasaki; Formation of Silicon Membrane: Patent Abstracts of Japan: Publication Date: Oct. 17, 1995; Publication No. 07267621 A; Japanese Patent Office, Japan.

(Continued)

*Primary Examiner*—Matthew Smith
*Assistant Examiner*—Nicholas J. Tobergte
(74) *Attorney, Agent, or Firm*—Andrew D. Fortney

(57) ABSTRACT

Methods for repairing an electrical circuit; compositions, inks and equipment for making such repairs; and repair structures formed by the methods. The method generally includes the steps of: (a) depositing a composition comprising nanoparticles of an electrically functional material such that it contacts first and second elements of the circuit; and (b) sufficiently irradiating at least part of the composition with light to fuse or bind the nanoparticles to each other. The composition and ink generally comprise such nanoparticles and a sensitizer having a light absorption maximum at a wavelength different from that of the nanoparticles. The apparatus comprises: (1) a deposition apparatus configured to deposit a liquid film of an electrically functional material on the circuit; (2) a light source configured to irradiate at least part of the thin film; and (3) a table configured to secure the substrate. The structure generally comprises a circuit element having an electrical disconnect, and a cured electrically functional material (i) in electrical contact with first and second locations on the circuit elements adjacent to the disconnect, and (ii) forming a continuous electrical path between the disconnected circuit portions. The present invention provides a fast, reliable method for repairing electrical circuits. The repair structures have electrical properties similar to the corresponding bulk or sheet materials. The invention is well suited for use with existing circuit inspection and testing equipment, thereby providing a "one tool" solution to testing and repairing electrical circuits.

80 Claims, 12 Drawing Sheets

U.S. PATENT DOCUMENTS

| | | |
|---|---|---|
| 6,457,478 B1 * | 10/2002 | Danese ................... 134/1.3 |
| 6,331,348 B1 | 4/2003 | Sakai et al. |
| 6,890,624 B1 * | 5/2005 | Kambe et al. ........... 428/195.1 |
| 2003/0124259 A1 | 7/2003 | Kodas et al. |
| 2003/0161959 A1 * | 8/2003 | Kodas et al. ............ 427/376.2 |
| 2004/0079195 A1 * | 4/2004 | Perry et al. ................ 75/345 |
| 2004/0113243 A1 * | 6/2004 | Blalock ..................... 257/670 |
| 2004/0202953 A1 * | 10/2004 | Jones et al. ................ 430/141 |
| 2004/0255848 A1 | 12/2004 | Yudasaka et al. |
| 2005/0129383 A1 | 6/2005 | Renn et al. |
| 2005/0141150 A1 | 6/2005 | Bentley et al. |
| 2005/0145163 A1 | 7/2005 | Matsuki et al. |
| 2006/0008590 A1 | 1/2006 | King et al. |

OTHER PUBLICATIONS

Tottori Isao; Semiconductor Device and Manufacture Thereof; Patent Abstracts of Japan; Application No. 08180501; Application Date Jul. 10, 1996; Application Publication Date Jan. 27, 1998; Japan Patent Office.

* cited by examiner

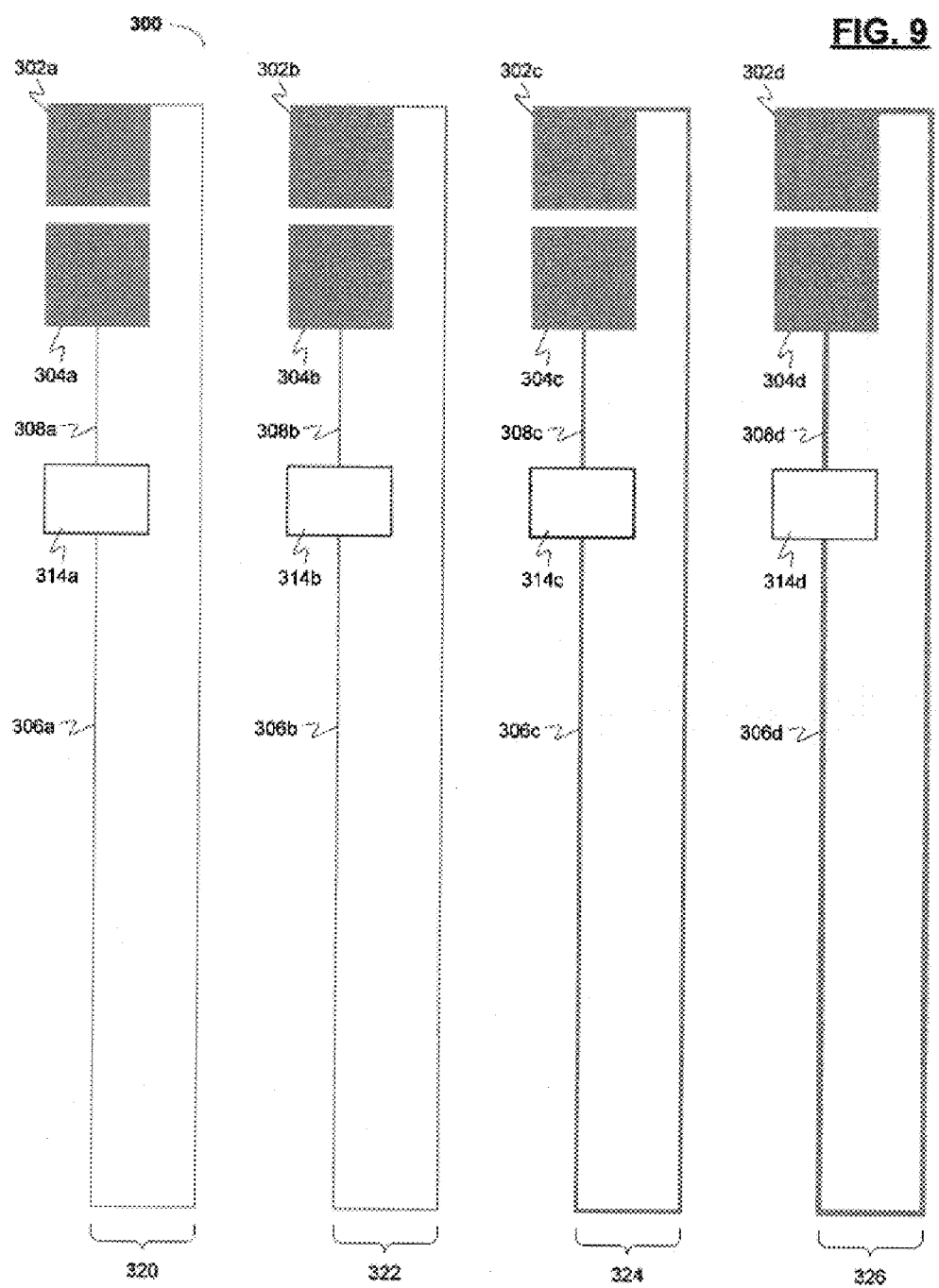

METHODS OF LASER REPAIRING A CIRCUIT, COMPOSITIONS AND EQUIPMENT FOR SUCH METHODS, AND STRUCTURES FORMED FROM SUCH METHODS

RELATED APPLICATION(S)

The present application may be related to U.S. application Ser. Nos. 10/616,147 and 10/749,876, respectively filed Jul. 8, 2003 and Dec. 31, 2003 and entitled "Compositions and Methods for Forming a Semiconducting and/or Silicon-Containing Film, and Structures Formed Therefrom" and "Radiation Patternable Functional Materials, Methods of Their Use, and Structures Formed Therefrom", each of which is incorporated herein by reference in its entirety.

FIELD OF THE INVENTION

The present invention generally relates to the fields of laser repair of electronic circuitry and laser patternable thin films. More specifically, embodiments of the present invention pertain to methods, compositions and equipment for repairing a circuit and to an electrically functional thin film and/or patterned structure formed from such a film.

SUMMARY OF THE INVENTION

Embodiments of the present invention relate to thin film structures and to methods, compositions and equipment for making patterned, electrically functional thin films. The method of repairing a circuit generally comprises the steps of: (a) depositing a thin film composition comprising nanoparticles of at least one electrically functional material on or over a region of the circuit to be repaired such that the thin film composition contacts first and second elements of the circuit; and (b) irradiating at least a portion of the thin film composition with a wavelength of light for a length of time and at an intensity sufficient to convert the fuse the nanoparticles or bind the nanoparticles to each other. The composition and ink generally comprise nanoparticles of an electronically functional material, and a sensitizer having a light absorption maximum at a wavelength different from that of the nanoparticles. The apparatus for repairing an electrical circuit comprises: (1) a deposition apparatus configured to deposit a thin film of an electrically functional material from a liquid phase in a predetermined pattern on a substrate comprising the electrical circuit; (2) a source of light configured to irradiate at least a portion of the thin film; and (3) a platform or table configured to support and secure the substrate such that the thin film may be deposited on first and second exposed portions of the electrical circuit and irradiated with the light. The thin film structure generally comprises one or more circuit elements having an anomalous electrical resistance or an electrical disconnect therein or therebetween; and a cured electrically functional material comprising light-irradiated nanoparticles, the cured electrically functional material (i) being in electrical contact with first and second locations on the one or more circuit elements adjacent to the anomalous electrical resistance or the electrical disconnect, and (ii) forming a continuous, electrically conductive path between the first and second locations.

The present invention advantageously provides a quick, reliable method for repairing electrical circuits that is very flexible and adaptable to a wide variety of different applications. The repair structures generally have electrical properties (e.g., resistivity) within an order of magnitude of corresponding bulk or sheet materials, yet take a fraction of the time to form because a number of conventional photolithographic processing steps are avoided. Perhaps most advantageously, the present invention is well suited for use with existing circuit inspection and testing equipment. These and other advantages of the present invention will become readily apparent from the detailed description of preferred embodiments below.

BRIEF DESCRIPTION OF THE DRAWINGS

FIG. 9 is a mask pattern comprising a series of conductive lines and probe pads for testing the present invention.

DETAILED DESCRIPTION OF THE PREFERRED EMBODIMENTS

Figure 1A:
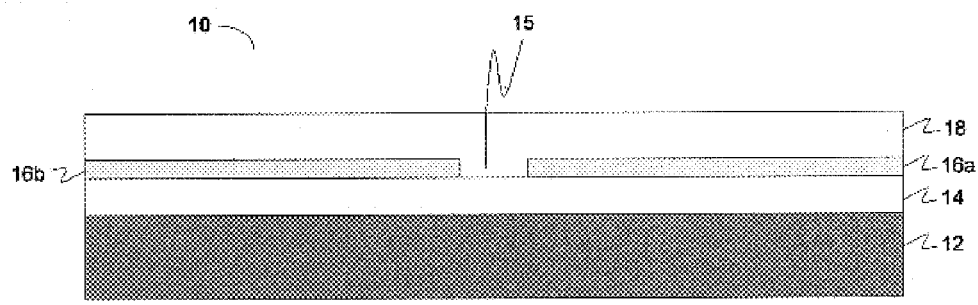
FIGS. 1A-1F show cross-sections of starting, intermediate and final structures at various points in a first embodiment of the present circuit repair process.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

The present invention concerns a method, comprising the steps of: (a) depositing a thin film composition comprising nanoparticles of at least one electrically functional material on or over a region of the circuit to be repaired such that the thin film composition contacts first and second elements of the circuit; and (b) irradiating at least a portion of the thin film composition with a wavelength of light for a length of time and at an intensity sufficient to fuse the nanoparticles or bind the nanoparticles to each other. In preferred embodiments, the method further comprises developing and/or curing the irradiated composition.

A further aspect of the invention concerns a composition and ink, comprising nanoparticles of an electronically functional material, and a sensitizer having a light absorption maximum at a wavelength different from that of the nanoparticles. The ink may further comprise a solvent and/or a surface tension reducing agent, a surfactant, a binder and/or a thickening agent, but may advantageously omit such additives or agents.

An even further aspect of the invention concerns an apparatus for repairing an electrical circuit, comprising: (1) a deposition apparatus configured to deposit a thin film of an electrically functional material from a liquid phase in a predetermined pattern on a substrate comprising the electrical circuit; (2) a source of light configured to irradiate at least a portion of the thin film; and (3) a platform or table configured to support and secure the substrate such that the thin film may be deposited on first and second exposed portions of the electrical circuit and irradiated with the light. In further embodiments, the repair apparatus further comprises a local development apparatus.

A still further aspect of the invention relates to a thin film structure comprising a one or more circuit elements having an anomalous electrical resistance or an electrical disconnect therein or therebetween; and a cured electrically functional material comprising light-irradiated nanoparticles, the cured electrically functional material (i) being in electrical contact with first and second locations on the one or more circuit elements adjacent to the anomalous electrical resistance or the electrical disconnect, and (ii) forming a continuous, electrically conductive path between the first and second locations. In preferred embodiments, the structure may be formed by the present method as described herein.

The invention, in its various aspects, will be explained in greater detail below with regard to exemplary embodiments.

Exemplary Methods of Repairing a Circuit

The present invention further relates to method of repairing a circuit, comprising the steps of: (a) depositing a thin film composition comprising nanoparticles of at least one electrically functional material on or over a region of the circuit to be repaired such that the thin film composition contacts first and second elements of the circuit; and (b) irradiating at least a portion of the thin film composition with a wavelength of light for a length of time and at an intensity sufficient to convert the nanoparticles to an electronically functional film or fuse or bind the nanoparticles to each other. This method enables quick and effective repair of electrical circuits using existing test equipment with minimum modifications and/or additions.

FIGS. 1A-1F show starting, intermediate and final structures formed in one embodiment of the present circuit repair method. More specifically, as shown in FIG. 1A, a circuit portion 10 comprises a substrate 12, a first or lower dielectric layer 14, conductive line 16*a*-16*b* on dielectric layer 14 and having an electrical disconnect 15 therein, and a second or upper dielectric layer 18 on conductive line 16*a*-16*b*. Electrical disconnect 15 may take the form of a gap or space between first and second conductive circuit elements 16*a* and 16*b*, or it can be any anomalous electrical resistance in a conductive portion of the circuit, e.g., a region or location in a wire having a resistance, in various embodiments, of about ten times, twenty times or one hundred times the sheet resistance of the electrically conductive material or more.

Figure 1B:
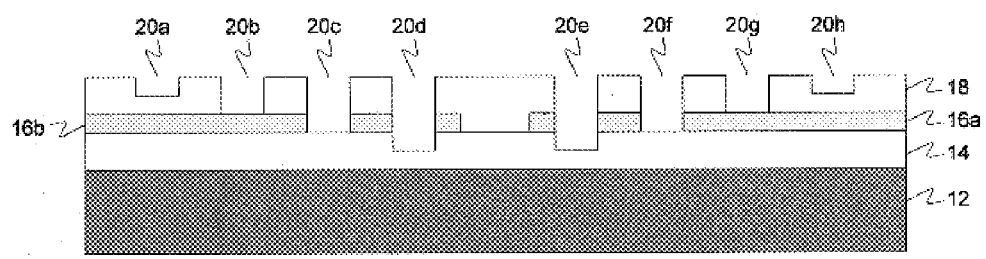

Referring now to FIG. 1B, a first step of this first embodiment comprises forming openings (e.g., holes 20*a*-20*h*) in upper layer 18 sufficient to expose a part of conductive line portions 16*a* and 16*b*. In this case, two series of holes 20*a*-20*d* and 20*e*-20*h* of successively increasing and decreasing depths, respectively, are formed because, for example, one may not necessarily know the thicknesses of upper dielectric layer 18 and conductive line 16*a*-16*b*. A plurality of openings on each side of the subsequently formed repair structure adds mechanical strength to the repair structure, increasing one's likelihood of successful repair. Especially when one expects to perform a relatively large number of repairs in a relatively short period of time, likelihood of repair success is an important factor in repair process reliability.

Holes 20*b*-20*g* have sufficient depth to (i) expose parts of conductive line portions 16*a* and 16*b* and (ii) enable a subsequently deposited thin film composition to contact first and second conductive line elements 16*a* and 16*b* of the circuit. Thus, in the present method of repairing a circuit, the substrate generally comprises two conductive structures electrically disconnected from each other, the method further comprises exposing portions of the electrically disconnected conductive structures, and the composition is deposited in a pattern that overlaps with the exposed portions of the electrically disconnected conductive structures.

Holes 20*c*-20*f* may have a width (in this case, the dimension the axis of which is perpendicular to the plane of the page) less than that of conductive line portions 16*a* and/or 16*b*, and thus, may not necessarily form additional electrical disconnects in conductive line 16*a*-16*b*. One should be cautious not to form openings such that their depth is sufficient to expose parts of conductive elements below the circuit element(s) having the electrical disconnection, to avoid inadvertent shorts in other parts of the circuit.

Thus, the method may further comprise the step of exposing the first and second circuit elements, prior to the depositing step. Preferably, the exposing step comprises laser ablation. The method may also further comprise, after the exposing step and prior to the depositing step, the step of preparing a surface of the first and second circuit elements for the depositing. Preferably, the preparing step comprises cleaning the surface of the first and second circuit elements, more preferably cleaning the entire exposed surface of the area or region of the circuit to be repaired.

Figure 1C:
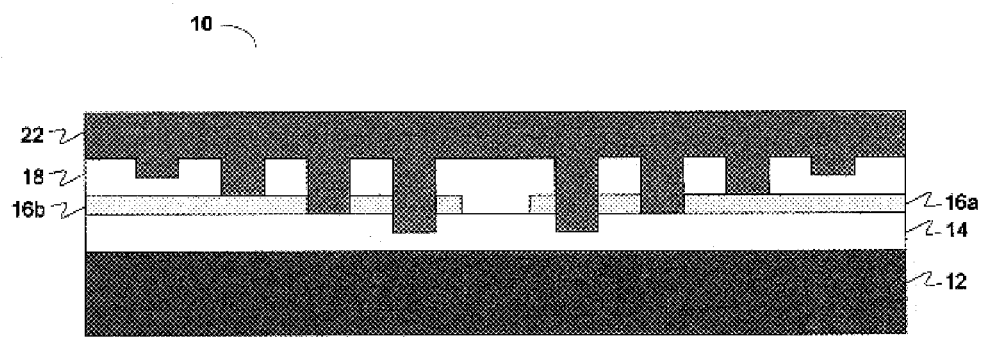

Referring now to FIG. 1C, the method comprises depositing thin film composition 22 onto upper layer 18 and into holes 20*a*-20*h*. The composition generally comprises nanoparticles of a conductive material, usually a metal (but which may be a semiconductor), and is discussed in greater detail below. What is unusual about composition 22 is that it generally includes a photoactive species that selectively absorbs light of certain wavelengths at a greater efficiency than other wavelengths, and changes (directly or indirectly) the solubility characteristics of the composition upon irradiation with appropriate wavelength(s) of light, and can be rendered electronically functional after such irradiation (and/or with additional curing). The composition may be deposited onto the region of the circuit to be repaired by any known method, including dropping, spraying, ejecting or nebulizing a solution, emulsion, suspension or aerosol of the composition onto the substrate, inkjet printing the composition in a solvent in a pattern onto the substrate, and even writing the composition in the pattern on the substrate (particularly when the composition further comprises a solvent). Alternatively, one could even deposit a composition comprising nanocrystals of an electromagnetically functional material onto the substrate by carrying small diameter nanocrystals (e.g., $\leq 10$ μm diameter) in an inert gas stream, directed at the area of the substrate onto which the composition is to be deposited.

Figure 1D:
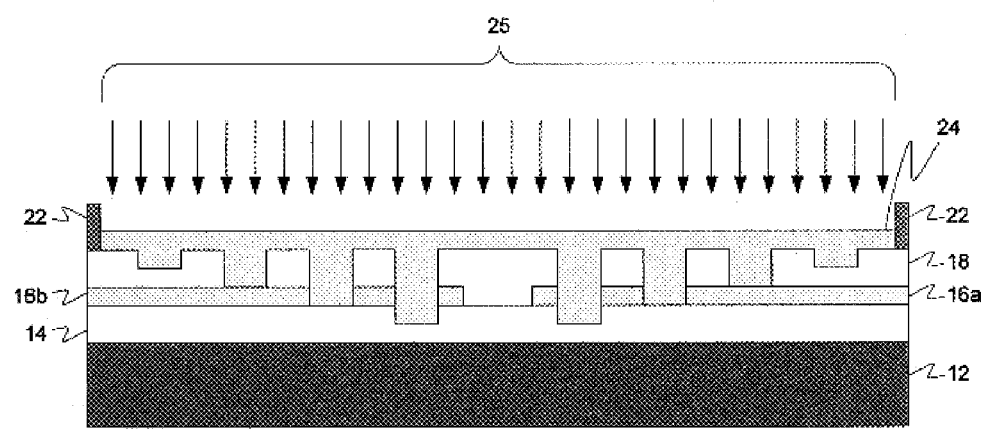

Referring now to FIG. 1D, the composition 22 is irradiated with light 25, generally from a laser (not shown, but discussed in greater detail below with respect to an exemplary apparatus for repairing a circuit), forming irradiated repair structure 24. Irradiation is conducted using a wavelength of light for a length of time and at an intensity sufficient to convert the nanoparticles to an electronically functional film, or bind or fuse the nanoparticles to each other. Thus, in the present circuit repair method, after the irradiating step, the thin film generally forms electrical connections to each of the electrically disconnected conductive structures.

In general, the length of time during which the thin film composition is irradiated is sufficient to convert the composition into an electrically conductive thin film. Furthermore, the wavelength and/or the intensity of the light the present method is generally sufficient to improve adhesion of the electronically functional thin film such that the electronically functional thin film withstands subsequent development, cleaning and/or processing steps.

In a preferred embodiment, the source of light for the irradiating step comprises a laser, more preferably a laser diode. The light may be from any part of the spectrum (e.g., ultraviolet [UV] light, infrared [IR] light, or visible light). In one embodiment, the light comprises ultraviolet light, and in another, infrared light. For example, in the latter embodiment, the light may consist essentially of infrared light with an emission maximum of from about 800 to about 850 nm. Preferably, the light for irradiating has a relatively narrow bandwidth, rather than a broad bandwidth (such as that provided by a visible light flood lamp). For example, the light may consist essentially of light having a bandwidth of 40 nm or less, preferably about 20 nm or less.

Preferred UV radiation sources include those with an emission at 254 nm (e.g., a conventional handheld UV-lamp, a high-pressure Hg lamp, etc.), as are known in the art. In one embodiment, a patterned film can be generated by irradiating the uncured film with UV or IR light from a focused laser, thereby converting the irradiated film to a solid material (i) insoluble in a developer and/or (ii) adherent to the substrate in subsequent processing steps, and leaving the non-irradiated film essentially unchanged.

Furthermore, the light may be selected to have certain properties, and/or the wavelength may be selected such that it has a penetration depth, such that the illumination intensity at an interface between the thin film composition and the first and second elements of the circuit is sufficiently high to convert nanoparticles near the interface to an electronically functional film. In such embodiments, the intensity at the interface is generally >25% of the corresponding incident intensity (i.e., the intensity at the upper surface of the deposited thin film composition). In the present method, the pre-existing electrically functional elements in the circuit generally absorb the wavelength of irradiation light at a sufficiently low efficiency so as to prevent detrimental effects to the element and/or adjacent element(s) (e.g., the efficiency is sufficiently low that the risk or likelihood of such detrimental effects happening under thin film composition irradiation conditions is commercially acceptable).

Figure 1E:
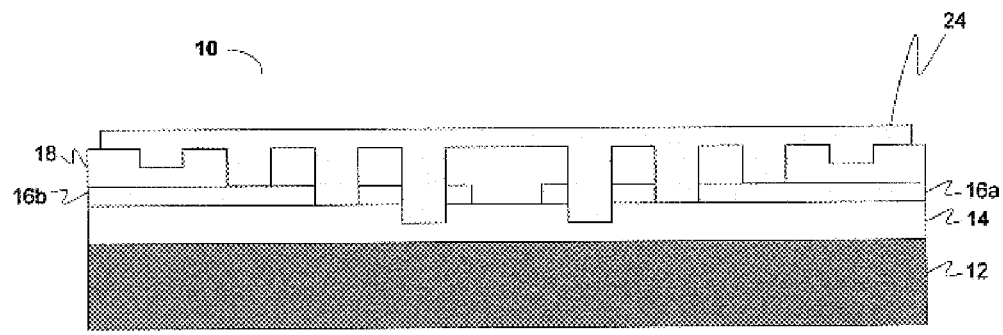

Referring now to FIG. 1E, after developing composite layer 22/24 (e.g., washing with a suitable solvent and drying the remaining structure; see the exemplary "local development" method described below), the unexposed composition 22 will be washed away, whereas the exposed repair structure 24 remains relatively intact. Thus, in a preferred embodiment, the method further comprises the step of developing the irradiated thin film to remove non-irradiated portions of the composition. In a particularly preferred embodiment, the developing step of the method comprises locally rinsing the patterned functional thin film with a developer.

Figure 1F:
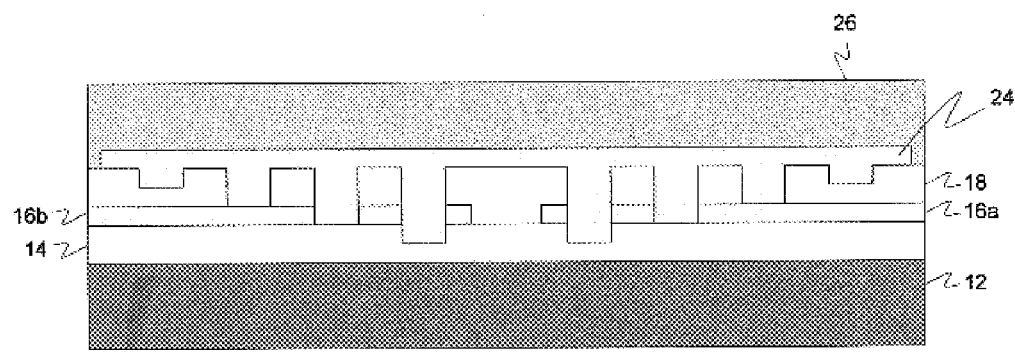

Referring now to FIG. 1F, a cap or sealant layer 26 is formed over repair structure 24 and any adjacent upper layer 18 to encapsulate the repaired circuit elements 16a and 16b. Sealant layer 26 may comprise any suitable sealant, such as conventional dielectric materials (such as silicon dioxide, silicon nitride, silicon oxynitride, etc.) or conventional insulators (such as sealing polymers), and may be applied by any conventional method for doing so (e.g., a spin-on process, a CVD process, a dropper or sprayer which may apply a controlled amount of sealant composition to a targeted or controlled area, etc.).

Thus, the method may further comprise covering a repair area formed by the irradiated thin film composition with a coating, passivation or capping material. The covering step may comprise dispensing a liquid precursor onto the repair area, the liquid precursor forming the coating, passivation or capping material upon further treatment or processing such as by laser curing the liquid precursor (or other conventional method for hardening liquid encapsulants, such as annealing a spin-oh glass). The liquid precursor may comprise a polyimide, a spin-on glass, a polysesquiloxane, a polyparaxylene, or polydimethylsiloxane (PDMS). In a further embodiment, the liquid precursor comprises a polyimide and a conventional thermal sensitizer.

Figure 2A:
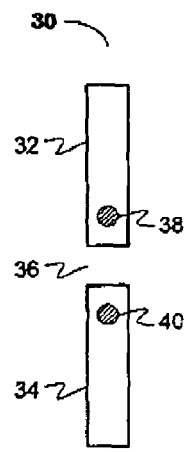
FIGS. 2A-2D show top views of starting, intermediate and final structures at various points in a second embodiment of the present circuit repair process.

FIGS. 2A-2D show starting, intermediate and final structures formed in a second embodiment of the present circuit repair method. More specifically, as shown in FIG. 2A, a conductive structure 30 comprises first conductive circuit element 32 and second conductive circuit element 34 having electrical disconnect 36 therebetween. Similar to the first embodiment described above, holes 38 and 40 are formed in a dielectric layer overlying first and second conductive circuit elements 32 and 34, sufficient to expose portions of the first and second conductive circuit elements 32 and 34. Such holes may be formed by any known process, such as masking and etching, laser etching, fast ion bombardment, controlled application of liquid (isotropic) etchant, etc. For reasons that will become apparent below, laser etching ("laser drilling" or laser ablation) is preferred. Laser drilling has a number of advantages, such as relatively easy adaptability to (1) the equipment and/or apparatus to be used for other steps in the repair process (some of which also advantageously use laser irradiation); (2) use of sensitizable etchants (e.g., selective absorption and/or laser activation of reagents which may be applied to the dielectric layer or which may be in the gas phase, and which, upon photoreaction, form a suitable etchant); (3) additional and/or subsequent surface treatments (e.g., etching in the presence of an oxygen source such as dioxygen to enhance the wettability of the surface); (4) surface energy patterning (e.g., irradiation of a predetermined portion of the surface to modify its stress and/or strain characteristics); and (5) reproducible formation of holes of predetermined depth (for a given material being drilled). Where convenience and throughput considerations influence the number of openings to be made, one opening to each unconnected circuit element is generally sufficient.

Figure 2B:
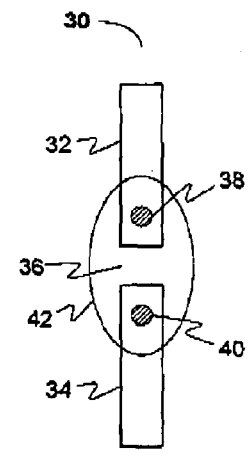
Figure 2C:
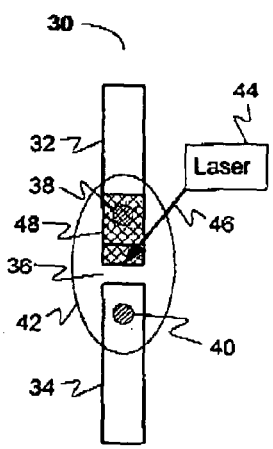

FIG. 2B shows the result of depositing a repair composition 42 onto a region of the circuit 30 that includes disconnect 36 and portions of first and second conductive circuit elements 32 and 34 containing holes 38 and 40. Referring now to FIG. 2C, repair composition 42 is irradiated with light 46 from laser 44 to form irradiated composition 48. The composition 42 may be irradiated in the liquid phase (e.g., while in solution or suspension), or in the solid phase (e.g., after drying), but liquid phase irradiation is preferred. As the laser traverses the locations on circuit 30 above hole 38 and disconnect 36, the irradiated composition 48 generally attains electrically functional properties. Alternatively, controlled, focused irradiation and/or curing can be provided by other equipment, such as an atomic force microscope (AFM), but for reasons of cost and convenience, a laser is the preferred source of irradiation. In addition, multiple light sources, each producing a different band of irradiation (range and/or set of wavelengths), may be used for different substeps of the process (e.g., tacking and/or increasing adhesion vs. curing). The location and/or direction of laser 44 may be driven, e.g., by conventional computer-controlled motors. After the laser traverses hole 40, the functional repair structure 48 is essentially finished (see FIG. 2D). Laser curing of the composition may produce a conductive structure having profiled walls, which tend to provide commercially acceptable edge coverage (e.g., at the edge of the conductive structure being repaired). However, additional steps may be desired, as will be explained below.

Figure 2D:
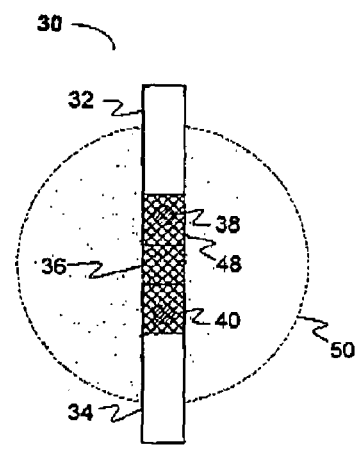

Continuing to refer to FIG. 2D, an area 50 encompassing the region onto which thin film composition 42 was deposited is identified for local development. A local development apparatus (described in greater detail below with reference to FIGS. 4D, 5A and 6A-6C) sprays, washed or rinses area 50 with a developer, which is selected so that non-irradiated composition 42 has a materially or significantly higher solubility therein than does irradiated repair structure 48. The developer may comprise, for example, an organic solvent. Solvent rinsing or washing may include the same procedure(s) as are typically used in photoresist development and/or photoresist etching (e.g., rinsing, immersing, spraying, vapor condensation, etc.). Preferred solvents include solvents in which the non-irradiated nanoparticles have a high solubility, such as the hydrocarbons and ethers described below for the exemplary ink solvent.

The local development apparatus may be further configured to remove the developer and non-irradiated composition 42. Alternatively, the non-irradiated repair composition can be removed by (i) application of liquid polymer or adhesive to the repaired area to adhere the non-irradiated repair composition thereto, and lifting off the polymer or adhesive once it solidifies; (ii) removing (by a similar process) with adhesive tape; (iii) depositing dry ice onto the area (e.g., with a dry ice gun) and removing under vacuum (so-called "dry ice ablation"); and/or (iv) laser ablation.

The remaining structure may be dried (e.g., by passing an inert and/or filtered gas over the structure) and/or further cured (e.g., by sintering at a temperature of 150° C. or higher, and in other implementations, 350° C. or higher, 400° C. or higher, or 450° C. or higher). However, in one embodiment, heated drying may take place before developing, e.g., to improve adhesion and/or film characteristics. Preferred further curing conditions also include curing in a reducing atmosphere such as an argon/hydrogen mixture. Such conditions are believed to remove hydrogen and carbon-containing species from the nanoparticle-based film effectively and/or at a suitable rate. Such temperatures are believed to remove hydrogen and carbon-containing species from the film effectively and/or at a suitable rate, in part to promote nanoparticle sintering and/or continuous thin film formation.

Typically, curing times may vary from 10 seconds to 60 minutes (preferably 30 seconds to 30 minutes) depending on the applied temperature and the desired film characteristics (e.g., density or extent of densification, level or percentage of crystallinity, doping or impurity level, doping profile, etc.) The curing step in the present repair method may comprise (i) drying the repair structure and the substrate, and/or (ii) heating the repair structure. In certain implementations, the curing step further comprises (a) placing the substrate into a chamber, and evacuating the chamber; (b) passing an inert or reducing gas into the chamber; and/or (c) heating the irradiated composition and/or repair structure.

Curing preferably takes place in an inert or reducing atmosphere. Suitable inert atmospheres may include one or more oxygen-free inert gases, such as nitrogen and the noble gases (He, Ne, Ar, Kr, and Xe). Reducing atmospheres generally comprise a reducing gas (such as hydrogen, methane, ammonia, phosphine, silane, germane, or a mixture thereof) or a mixture of one or more reducing gasses with one or more inert gasses.

Thus, the present method may further comprise thermally processing (e.g., heating and/or curing) the irradiated portion of the thin film composition (so-called "local heating"). In various embodiments, local heating comprises flowing heated gas (e.g., in the form of a jet from a conventional gas nozzle, nipple or outlet) over the irradiated portion of the thin film composition. Alternatively, thermal processing may simply comprise placing the repaired circuit in a conventional oven (such as a rapid thermal annealing oven or furnace).

The method may also further comprise the step of post-thermal processing the irradiated portion of the thin film composition. The post-thermal processing may comprise exposing the irradiated portion of the thin film composition to radiation, preferably locally exposing the irradiated portion of the thin film composition to radiation (so as not to affect areas of the circuit away from the repair). This may be conveniently accomplished when the radiation is provided by a laser, the light from which can be easily focused in a desired and/or predetermined location or pattern. In this embodiment, the radiation generally has a wavelength of less than 500 nanometers, so that it is substantially absorbed in a metal or dielectric circuit element. However, it is not required that the repaired circuit first undergo thermal processing in order to subject it to post-thermal processing. The order may be reversed, or the thermal processing step may be completely omitted, as laser irradiation (a preferred technique for post-thermal processing) generally results in heating the irradiated feature ot structure. Generally, post thermal processing is conducted sufficiently to improve a conductivity of the irradiated portion of the thin film composition, to improve adhesion of the irradiated portion of the thin film composition to an underlying or adjacent layer, or to relax a stress and/or improve a morphology or edge profile of the irradiated portion of the thin film composition. For example, due to deposited film shrinkage and/or thermal and optical effects during curing, the edge of a laser-irradiated line can sometimes have a rough and/or non-square profile in which the top edge of line actually overhangs the sidewall (e.g., the sidewall is rough and/or is angled inward; a so-called "re-entrant edge profile"). Post-development thermal processing (and more specifically, RTA treatment) is capable of substantially reducing and/or eliminating such overhang and/or sidewall roughness.

In a preferred implementation, the same apparatus or tool can test and repair the circuit in one process. Thus, the method may further comprise the step of examining or testing the circuit to find and/or locate the region to be repaired. Because the repair materials, method(s) and equipment are capable of forming electrically functional circuit elements of all conduction types (i.e., conducting, semiconducting and insulating), the same apparatus or tool can also make circuits and/or circuit elements, in addition to testing and repairing the circuit. Thus, the method may further comprise fabricating a circuit or circuit element prior to the examining or testing step, more preferably where each of the fabricating, the examining or testing, the depositing and the irradiating steps are performed by a single tool. A commercially important advantage of such a process and/or tool is that they are theoretically capable of producing circuit(s) and/or assemblies of circuits with 100% operational yield in a single operational step, before continuing on to subsequent fabrication or integration step(s).

In another aspect, the present invention relates to a method of repairing a circuit, comprising the steps of (a) depositing a thin film composition comprising a liquid-phase or solution precursor to a semiconducting material on or over a region of the circuit to be repaired such that the thin film composition contacts at least one element of the circuit; and (b) irradiating at least a portion of the thin film composition with a wavelength of light for a length of time and at an intensity sufficient to convert the precursor to an electronically functional film, or otherwise render the solution precursor insoluble in a subsequent developing step. This alternative is particularly applicable to formation of semiconductor structures, such as transistors, diodes, resistors, capacitors, etc. Thus, a result of this alternate method is to repair a circuit by adding a new semiconducting element to the circuit.

In a preferred embodiment, the precursor includes a silane that is liquid at 25° C. More preferably, the silane comprises a $C_3$-$C_8$ cyclosilane, such as those described in U.S. application Ser. No. 10/616,147, filed Jul. 8, 2003 and entitled "Compositions and Methods for Forming a Semiconducting and/or Silicon-Containing Film, and Structures Formed Therefrom". In this aspect, the method may further comprise the step of oxidizing or nitriding the deposited thin film composition sufficiently to produce an insulating feature or layer, such as those typically used in conventional this film transistors and/or integrated circuit or display device capacitors.

Exemplary Compositions

In one aspect, the present invention relates to a composition for forming patterned thin films. The composition generally comprises (a) nanoparticles of an electronically functional material, the nanoparticles having a light absorption maximum at one or more first wavelengths; and (b) a sensitizer having a light absorption maximum at a second wavelength different from each of the first wavelengths. In another aspect, nanoparticle-containing compositions that undergo a substantial or material change in their solubility in a developer upon irradiation with a predetermined wavelength or band of light (see, e.g., U.S. Ser. No. 10/749,876, entitled "Radiation Patternable Functional Materials, Methods for Their Use and Structures Formed Therefrom," filed Dec. 31, 2003) are also suitable for use in the present invention.

The nanoparticles may comprise nanoparticles of any electronically functional material, such as a metal, semiconductor or insulator, and they may be amorphous, crystalline and/or polycrystalline. Doped semiconductor nanoparticles are described in U.S. Pat. Nos. 6,200,508 and 6,072,716, both to Jacobson et al., the relevant portions of which are incorporated herein by reference. However, in one embodiment, the nanoparticles preferably comprise metal nanoparticles; in another, the nanoparticles comprise a precursor to a semiconducting film (e.g., a semiconductor); and in a third, the nanoparticles comprise a precursor to a dielectric film (e.g., a dielectric compound or material, or a compound or material that can be oxidized and/or nitrided into a dielectric compound or material). Nanoparticles of semiconducting materials suitable compositions for use in the present invention include those described in U.S. Ser. No. 10/616,147, entitled "Compositions and Methods for Forming a Semiconducting and/or Silicon-Containing Film, and Structures Formed Therefrom," filed Jul. 8, 2003, U.S. application Ser. No. 10/339,741, filed Jan. 8, 2003 and entitled "Nanoparticles and Method for Making the Same", and/or U.S. Pat. Nos. 6,200,508 and 6,072,716, both to Jacobson et al., the relevant portions of which are incorporated herein by reference.

Insulator films may be formed from a composition containing nanoparticles of an insulator material, such as an oxide, nitride, oxynitride or sulfide of a metal or metalloid, such as aluminum, silicon, germanium, tin, lead, indium, zinc, iron, manganese, chromium, molybdenum, tungsten, vanadium, tantalum, titanium, zirconium, and combinations thereof (e.g., silicon dioxide, silicon nitride, silicon oxynitride, aluminum oxide, zinc sulfide, indium tin oxide, tantalum nitride [which may have electrically conductive properties, but which for the purposes of this application can be considered an "insulator" film], etc.). Alternatively, insulator films may be formed from a composition containing nanoparticles of a metal or semiconductor material as described above, which is then exposed to an oxidizing and/or nitridizing agent, either during or after laser irradiation. Suitable oxidizing agents include dioxygen, ozone, nitric oxide, nitrous oxide, sulfur dioxide, sulfur trioxide or a mixture thereof, which may be dissolved in a suitable organic solvent or in an inert gas, such as nitrogen or a noble gas (He, Ne, Ar, Kr, Xe). Nitridizing agents include gases such as dinitrogen and ammonia, liquids such as hydrazine, and salts such as sodium azide, which can be reacted in solution phase or gas phase (except for the salts), and when reacted in solution phase, optionally in the presence of a conventional nitridation catalyst. Oxynitridizing agents may include nitrous oxide and nitrosylating agents such as nitrosyl chloride and nitrosyl bromide, which can be reacted in solution phase or gas phase, and which can be subsequent reduced (e.g., with hydrogen and a conventional catalyst for such reductions) to remove oxygen from the film.

Metal nanoparticles may comprise one or more metals selected from transition metals, noble metals, aluminum, indium, tin, lead, and alloys thereof. The term "alloy" refers not only to alloys of such metals with each other but also with other conventional alloying elements, such as silicon, carbon, boron, phosphorous, nitrogen, etc. In preferred embodiments, the electronically functional substance comprises or consists essentially of one or more of the following metals: Cr, Mo, W, Fe, Ru, Ni, Pd, Pt, copper (Cu), silver (Ag), gold (Au), and aluminum (Al). More preferably, the electronically functional substance comprises copper, silver or gold. In one implementation, the electronically functional substance consists essentially of silver.

In various embodiments, the composition may further comprise an organometallic compound (e.g., a compound having a defined molecular formula wherein one or more of the atoms is a metal atom). Typically, the metal in the organometallic compound is either the same as the metal or semiconductor in the nanoparticle, or it is a dopant, added in an amount configured to provide a certain change or modification of one or more electromagnetic properties of the cured nanoparticles. In other cases, the organometallic compound can serve as the (photo)sensitizer.

In other embodiments, the nanoparticles may have a passivation layer thereon (so-called "passivated nanoparticles"). The passivation layer may be chemically bound to the nanoparticles by covalent bonds, by coordination bonds, by hydrogen-bonding, by Van der Waals forces and/or by ionic bonds. Preferably, the passivation layer comprises one or more of the following: (i) a carboxylate or carboxylic acid; (ii) an alcohol and/or alcoholate; (iii) a thiol and/or thiolate; (iv) an alkyl, aryl and/or aralkyl group; (v) hydrogen; (vi) a halogen, such as F, Cl, Br, and/or I; and/or (vii) a surfactant, such as an amine, an amine oxide, a quaternary ammonium salt, a betaine, a sulfobetaine, an ether, a polyglycol, a polyether, a polymer, an organic ester, a phosphine, a phosphate, a sulfonic acid, a sulfonate, a sulfate, a ketone, and/or a silicone. More preferred passivation comprises (i) a carboxylate or carboxylic acid; (ii) a thiol and/or thiolate; or (iii) hydrogen.

In preferred embodiments, the carboxylate and/or carboxylic acid may comprise a $C_4$-$C_{20}$, branched or unbranched, saturated or unsaturated aliphatic carboxylic acid or salt thereof (such as butanoic acid, hexanoic acid, octanoic acid, decanoic acid, dodecanoic acid, tetradecanoic acid, hexadecanoic acid, 2-butenoic acid, 3-butenoic acid, 2-hexenoic acid, 4-hexenoic acid, 5-hexenoic acid, 2-octenoic acid, 6-octenoic acid, 7-octenoic acid, 2-decenoic acid, 9-decenoic acid, 10-decenoic acid, 2-dodecenoic acid, 11-dodecenoic acid, 2-tetradecenoic acid, 13-tetradecenoic acid, 2-hexadecenoic acid, 15-hexadecenoic acid, oleic acid, linoleic acid, linolenic acid, elaidic acid, behenic acid, eleostearic acid and/or arachidonic acid); or a $C_7$-$C_{17}$, branched or unbranched, substituted or unsubstituted aralkanoic acid or salt thereof (such as benzoic acid, $C_1$-$C_6$ alkyl-substituted benzoic acid, or a salt thereof). Polycarboxylic acids, such as long-chain alkanedioic acids (e.g., 1,7-octanedioic acid, 1,12-dodecanedioic acid), in an amount of, e.g., 1-10 mol % may cross-link two or more nanoparticles.

Similarly, the preferred thiol and/or thiolate may comprise a $C_4$-$C_{20}$, branched or unbranched, saturated or unsaturated aliphatic thiol or salt thereof (such as butanethiol, hexanethiol, octanethiol, decanethiol, dodecanethiol, tetradecanethiol, hexadecanethiol, 2-butenethiol, 3-butenethiol, 2-hexenethiol, 4-hexenethiol, 5-hexenethiol, 2-octenethiol, 6-octenethiol, 7-octenethiol, 2-decenethiol, 9-decenethiol, 10-decenethiol, 2-dodecenethiol, 11-dodecenethiol, 2-tetradecenethiol, 13-tetradecenethiol, 2-hexadecenethiol and/or 15-hexadecenethiol); or a $C_7$-$C_{17}$, branched or unbranched, substituted or unsubstituted aralkanethiol or salt thereof (such as benzyl mercaptan, $C_1$-$C_6$ alkyl-substituted benzyl mercaptan, or a salt thereof).

Unsaturated carboxylic acids, alcohols and/or thiols, particularly long-chain (e.g., $C_8$-$C_{20}$) unsaturated carboxylic acids, alcohols and/or thiols, may provide a mechanism or means by which passivated nanoparticles can be crosslinked with ultraviolet radiation. When such nanoparticles are selectively irradiated with an appropriate wavelength of UV light (e.g., with a laser), portions of the nanoparticle-containing composition may be crosslinked, while non-irradiated portions are not. These non-irradiated portions may then be removed with an appropriate developer to leave a radiation-patterned composition on the substrate that can then be subsequently cured as described above.

The surfactant in preferred embodiments of the present composition may comprise a tri-$C_1$-$C_{20}$ alkyl-substituted amine, a tri-$C_1$-$C_{20}$ alkyl-substituted amine oxide, a tetra-$C_1$-$C_{20}$ alkyl-substituted quaternary ammonium salt, a conventional betaine, a conventional sulfobetaine, a polyglycol of the formula H—(—OCH$_2$CH$_2$—)$_a$—OH (where $2 \leq a \leq 4$), a polyether of the formula $R^3$—(—OCH$_2$CH$_2$—)$_a$—OR$^4$ (where $R^3$ and $R^4$ are independently a $C_1$-$C_4$ alkyl group), a $C_4$-$C_{20}$ branched or unbranched, saturated or unsaturated aliphatic carboxylic acid ester of a $C_1$-$C_4$ alcohol or of the alcohols described in the above paragraph, a $C_4$-$C_{20}$ aliphatic carboxylic acid thioester of a $C_1$-$C_4$ thiol or of the thiols described above, a tri-$C_1$-$C_{20}$ alkyl- or triaryl-substituted phosphine (such as trimethyl phosphine, triethyl phosphine, or triphenyl phosphine), a tri-$C_1$-$C_{20}$ alkyl- or triaryl-substituted phosphate, a di-$C_1$-$C_{20}$ alkyl- or diaryl-substituted phosphate salt, an aryl or $C_4$-$C_{20}$ branched or unbranched, saturated or unsaturated aliphatic sulfonic acid, an aryl or $C_4$-$C_{20}$ branched or unbranched, saturated or unsaturated aliphatic sulfonate, a di-$C_1$-$C_{20}$ alkyl sulfate, a $C_1$-$C_{20}$ alkyl sulfate salt, a ketone of the formula $R^5$ (C=O) $R^6$ (where $R^5$ and $R^6$ are independently a $C_1$-$C_{20}$ alkyl or $C_6$-$C_{10}$ aryl group), and/or a conventional silicone. Surfactants are a preferred additive when hydrogen- and/or halogen-passivated nanoparticles are used, as they may facilitate or enable dispersion of such nanoparticles into aprotic and/or relatively nonpolar solvents.

In a further embodiment, the nanoparticles have an average diameter of about 100 nm or less, preferably less than or equal to 10 nm, more preferably about or less than 5 nm. Alternatively, the nanoparticles may have a size distribution range such that at least 90% (preferably, at least 95% and more preferably, at least 98%) of the nanoparticles have a diameter of from 0.1 nm to 100 nm, preferably from 0.2 nm to 10 nm, more preferably from 0.5 nm to less than 5 nm. The (average) diameter may be for the passivated nanoparticles, but preferably, it is an (average) particle diameter of the unpassivated nanoparticle core.

The present composition further comprises a sensitizer configured to selectively absorb a wavelength of irradiating light different from those wavelengths at which the nanoparticles have absorption maxima. A sensitizer is particularly useful in a composition where the nanoparticles are substantially transparent to the wavelength or band of irradiation (e.g., insulator-based nanoparticles). In various implementations, the wavelength of sensitizer absorption differs from the nanoparticles absorption maxima by at least 20 nm, 30 nm or 40 nm. In general, the sensitizer may be selected such that the nanoparticles fuse or otherwise bind to each other upon irradiation with light having the wavelength at which the sensitizer selectively absorbs. Without wishing to be bound to any particular theory, the sensitizer may cause nanoparticles to fuse or otherwise bind to each other by, for example, absorbing light and generating heat energy that is then transferred to the nanoparticles, or absorbing light at one wavelength and emitting light at another wavelength that is then absorbed by the nanoparticles.

The present composition may further comprise (i) a compound that enhances adhesion or electrical contact to an underlying or adjacent component and/or (ii) a compound that enhances the morphology of the thin film. The adhesion- and/or electrical contact-enhancing compound may be the same as or different from the morphology-enhancing compound, but generally, the two compounds are different. The adhesion- and/or electrical contact-enhancing compound may comprise one or more precursors or sources of Au, Cu, Pd, Cr, Ti, Ni, P, B, As, Si or Ge. The morphology-enhancing compound may comprise one or more precursors or sources of Pd, Cu, Co, or Si. The terms "precursor(s)" and "source(s)" refer to molecular species containing a metal, metalloid (e.g., Si or Ge) or dopant (e.g., P, B, or As) that remains after irradiation and/or curing, and to which are bound ligands and/or counterions (such as acetate, acetoacetonate, alkoxy, alkylthio, trialkylamine, tetraalkyldiamine, trialkyl- or triarylphosphine, etc.) that are removable under irradiation and/or curing conditions.

Exemplary Inks

In another aspect, the present invention concerns an ink for making an electrically functional thin film and/or repairing a circuit with such a film. The ink may comprise or consist essentially of, for example, the exemplary composition and a solvent in which the composition is soluble. In such embodiments, the nanoparticles may be present in the ink in a percentage by weight of from 0.1% to 50%, more preferably from 0.5 to 30 wt. %, and even more preferably from 1.0 to 20 wt. %.

In certain embodiments, the solvent in the present ink comprises an aprotic solvent and/or an apolar solvent. In the context of the present invention, an "apolar" solvent is one that may have a gas-phase dipole moment of about 2 debyes or less, preferably about 1 debye or less, and even more preferably about 0.5 debye or less. In many implementations, an apolar solvent has a dipole moment of about 0 debyes, due to its molecular symmetry (e.g., carbon tetrachloride, tetrachloroethylene, benzene, p-xylene, dioxane) or highly covalent nature of the chemical bonds therein (e.g., mineral spirits, hexane, cyclohexane, toluene). In other various embodiments, the present ink comprises a solvent having a boiling point of about or less than 250° C., preferably about or less than 200° C., and more preferably about or less than 150° C., at atmospheric pressure.

Exemplary solvents for the present ink composition include alkanes (e.g., $C_5$-$C_{12}$ branched or unbranched alkanes and cycloalkanes), alkenes (e.g., $C_6$-$C_{12}$ branched or unbranched alkenes and cycloalkenes), halogenated alkanes (e.g., $C_1$-$C_4$ alkanes having from 1 to 2n+2 halogen substituents and $C_3$-$C_6$ cycloalkanes having from 1 to 2n halogen substituents such as fluorine, chlorine and/or bromine, where n is the number of carbon atoms; preferably $C_1$-$C_2$ alkanes having from 2 to 2n+2 fluorine and/or chlorine substituents), halogenated alkenes (e.g., $C_2$-$C_4$ alkenes having from 1 to 2n halogen substituents and $C_3$-$C_6$ cycloalkenes having from 1 to 2n-2 halogen substituents such as fluorine, chlorine and/or bromine, where n is the number of carbon atoms; preferably $C_2$-$C_3$ alkenes having from 2 to 2n fluorine and/or chlorine substituents), arenes (e.g., benzene), substituted arenes (e.g., N-methylpyrrole or $C_6$-$C_{10}$ arenes having from 1 to 8 halogen substituents and/or $C_1$-$C_4$ alkyl and/or alkoxy substituents; preferably benzenes having from 1 to 6 fluorine, chlorine, $C_1$-$C_2$ alkyl and/or methoxy substituents), aliphatic ethers (e.g., ethers having two $C_2$-$C_6$ branched or unbranched alkyl groups, or 1 methyl group and one $C_4$-$C_6$ branched or unbranched alkyl group), cyclic ethers (e.g., tetrahydrofuran or dioxane), glycol ethers (e.g., of the formula $(CH_3(CH_2)_w)O((CH_2)_xO)_y(CH_2)_zCH_3)$, where x is independently 2-4 [preferably 2], y is 1-4 [preferably 1 or 2], and w and z are independently 0 to 3 [preferably 0]), and aliphatic esters (e.g., $C_1$-$C_6$ branched or unbranched alkyl esters of a $C_2$-$C_{20}$ branched or unbranched, saturated or unsaturated aliphatic acid), and polar aprotic solvents (such as aliphatic sulfoxides; e.g., dimethylsulfoxide).

The present ink may further comprise a dopant, a surface tension reducing agent, a wetting agent, a surfactant, a binder and/or a thickening agent, although no such additives are required. In fact, it is advantageous for the ink to exclude such additional components, particularly where such additional components include sufficiently high molar proportions of elements such as carbon, oxygen, sulphur, nitrogen, halogen or heavy metals to significantly adversely affect electrical properties of the printed thin film. However, where they are present, each of these additional components may be present in trace amounts in the present ink composition. The surface tension reducing agent, which is conventional, may be present in an amount of from 0.001 wt. % to 1 wt. %, preferably 0.005 wt. % to 0.1 wt. % of the ink composition. In certain embodiments, the surface tension reducing agent may comprise a conventional hydrocarbon surfactant, a conventional fluorocarbon surfactant or a mixture thereof. The wetting agent is generally present in an amount of from 0.005 wt. % to 1 wt. %, preferably 0.01 wt. % to 0.5 wt. % of the ink composition. In certain embodiments, the wetting agent comprises a fluorinated surfactant and/or a fluorinated hydrocarbon, as described in U.S. application Ser. No. 10/339,741, filed Jan. 8, 2003 and entitled "Nanoparticles and Method for Making the Same". The surfactant, which may be selected from those described above for the passivation layer, may be present in an amount of from 0.001 wt. % to 1 wt. %, preferably 0.005 wt. % to 0.5 wt. % of the ink composition. The binder and/or thickening agent, each of which is conventional, may be present in an amount sufficient to provide the ink composition with predetermined flow properties at a given processing temperature. However, typical amounts of these components in the composition are from 0.001 wt. % to 10 wt. %, preferably 0.01 wt. % to 5 wt. %

Exemplary Thin Film Structures

A further aspect of the invention relates to a thin film structure comprising one or more circuit elements on a substrate, the one or more circuit elements comprising first and second locations with having an anomalous electrical resistance or an electrical disconnect therein or therebetween; a cured electrically functional material comprising light-irradiated nanoparticles, the cured electrically functional material (i) being in electrical contact with the first and second locations on the one or more circuit elements adjacent to the anomalous electrical resistance or the electrical disconnect, and (ii) forming a continuous, electrically conductive path between the first and second locations. In a typical circuit structure, the cured electrically functional material comprises a substantially horizontal portion and first and second substantially vertical portions, the first and second substantially vertical portions respectively being in electrical contact with the first and second locations, e.g., as shown in FIGS. 1D-1F. The cured electrically functional material may further comprise a plurality of first substantially vertical portions in electrical contact with a first electrically disconnected portion of the circuit element and a plurality of second substantially vertical portions in electrical contact with a second electrically disconnected portion of the circuit element.

The circuit element can be any conventional circuit element or structure, such as a wire, a resistor, a capacitor, an inductor, a diode, a transistor (or part thereof), etc., the circuit element typically comprises a wire of electrically conductive material. In this preferred embodiment, the cured electrically functional material comprises a line having a width, length, thickness and (optionally) a "nearest neighbor" (interline) spacing. The width may be, in various embodiments, of from 100 nm to 100 µm, from 0.5 µm to 50 µm, or from 1 µm to 20 µm. The length may be, in various embodiments, of from 1 µm to 5000 pm, from 2 µm to 1000 µm, or from 5 µm to 500 µm. The thickness may be, in various embodiments, of from 0.001 µm to 100 µm, from 0.005 µm to 25 µm, or from 0.05 µm to 10 µm. The "nearest neighbor" spacing may be, in various embodiments, of from 100 nm to 100 µm, from 0.5 µm to 50 µm, or from 1 µm to 20 µm.

For example, and as shown in FIG. 9, the lines may comprise a pattern of substantially parallel and perpendicular sections, and these parallel and perpendicular sections may be within the same line or with reference to two or more different lines. Although parallel and perpendicular lines are shown (in part to minimize adverse effects from and/or maximize the predictability of the effect of electromagnetic fields from adjacent lines), lines may take any shape and/or take any course that can be designed and formed in an integrated circuit or on a printed circuit board.

In an alternative implementation, the present invention relates to a structure, comprising (i) one or more circuit elements on a substrate, the one or more circuit elements having an anomalous electrical resistance, conductance or transconductance or an electrical disconnect therein or therebetween; and (ii) a cured electrically functional material comprising light-irradiated nanoparticles and/or liquid phase semiconducting materials, the cured electrically functional materials (i) being in electrical contact with first and second locations on the one or more circuit elements adjacent to opposed ends of the anomalous electrical resistance, conductance, transconductance or the electrical disconnect, and (ii) forming an electrically conductive, semiconducting or nonconducting path between the first and second locations. This aspect of the invention is particularly targeted toward the repair of circuits by forming new or replacement semiconductor structures, such as a resistor, a capacitor, a diode or a transistor. Thus, an "anomalous electrical conductance or transconductance" generally refers to a circuit that is expected to exhibit semiconducting, resistive, or switching properties but which shows an unexpectedly high conductivity (for example due to a short in a transistor or a conductive "spike" through a semiconducting or insulating layer of material). Alternatively, an "anomalous electrical conductance or transconductance" can refer to a circuit that is expected to exhibit semiconducting, resistive or switching properties, but which shows an open or unexpectedly low conductivity (for example due to an etching defect, particle, crack, pinhole or delamination defect in a resistive, semiconducting or conducting layer of material). Also, the "cured electrically functional material" may comprise a series of such materials, generally stacked or layered on top of each other. For example, the nanoparticle-based composition may be deposited onto an adhesion promoter to form a stacked thin film bilayer.

An Exemplary Repair Apparatus

The invention further relates to an apparatus for repairing an electrical circuit, comprising: (a) a deposition apparatus configured to deposit a thin film of an electrically functional material from a liquid phase in a predetermined pattern on a substrate comprising the electrical circuit; (b) a source of light configured to irradiate the thin film; and (c) a platform or table configured to support and secure the substrate such that the thin film may be deposited on first and second exposed portions of the electrical circuit and irradiated with the light.

Figure 3A:
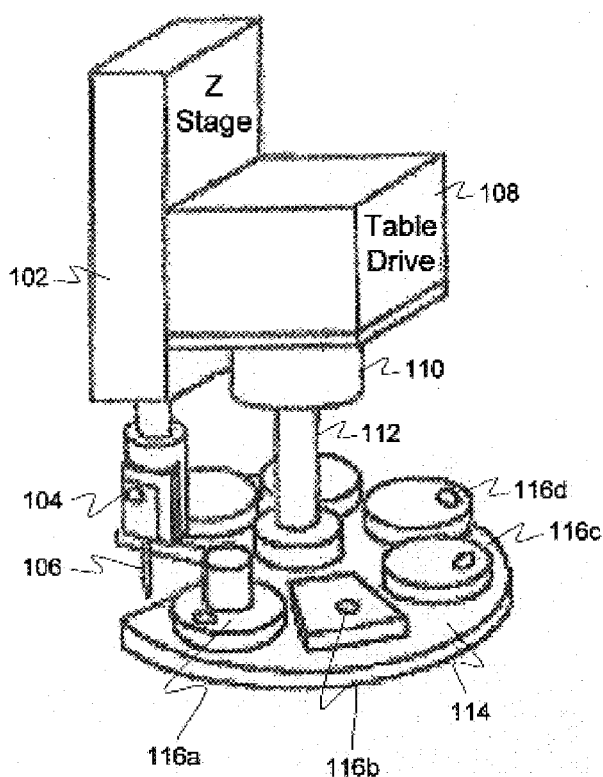
FIG. 3A shows one embodiment of an exemplary apparatus configured to carry out the present repair method.

FIG. 3A shows an exemplary apparatus 100 for repairing a circuit in accordance with the present invention. The exemplary apparatus comprises Z stage (controlled repair apparatus motor and housing) 102, a repair structure-forming apparatus 104, a microdropper (or composition deposition and/or application apparatus) 106, a controlled table drive motor and housing 108, chuck 110, table drive axle 112, table 114, and lenses and/or processing devices 116a-116d. Thus, the apparatus generally further comprises: (i) a housing configured to contain both the deposition apparatus and the source of light; (ii) a controllable table drive motor and housing; and/or (iii) circuit/substrate mounting devices securably affixed onto the platform or table. Z stage 102 is conventional, and may be configured to move repair apparatus 104 up or down in increments of, e.g., from 0.001 µm/step to 5 µm/step, 0.01 µm/step to 11 µm/step, or about 0.05 µm/step to about 0.5 µm/step, up to a maximum of, e.g., about 500 mm, about 200 mm, or about 100 mm. Table drive motor 108, table 114, and circuit substrate mounting devices 116a-116d are also conventional, and may be configured to move substrates to be repaired in two dimensions (parallel to the plane of table 114) in increments of, e.g., from 0.01 µm/step to 10 µm/step, 0.1 µm/step to 5 µm/step, or about 0.5 µm/step to about 1.0 µm/step. Lenses and/or processing devices 116a-116d are also generally conventional. The lenses will be described in more detail with respect to FIGS. 4A-B. Processing devices include laser drilling adapters, cleaning equipment, developing equipment, thermal processing equipment, optical and/or electrical test equipment, etc.

Figure 3B:
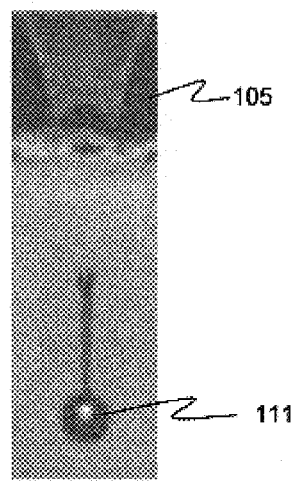
FIG. 3B is a photograph of the tip of an exemplary composition deposition apparatus configured for use with the exemplary repair apparatus.

Repair apparatus 104 is generally configured to perform most of the steps with regard to the exemplary repair method described above. Repair structure-forming apparatus 104 generally comprises composition deposition apparatus 106 and a light source (not shown in FIG. 3A). Composition deposition apparatus 106 may be a dropper, a needle, a microsyringe or even an inkjet head, adapted to deliver controlled microliter or picoliter amounts of a nanoparticle-based ink to the substrate for the formation of a repair structure (such as the exemplary repair structure described above). Inkjet heads may be adapted to deliver picoliter-sized droplets of repair composition to the substrate, but generally require a cleaning and maintenance assembly for the head, and may also require a movable housing that is configured to fit securely over the circuit area to be repaired and provide an atmosphere that can be purged. A needle can have an opening of from, e.g., 1 to 100 µm, 10 to 80 µm, or about 20 to about 60 µm, and thus be adapted to deliver sub-microliter amounts of repair composition to the substrate. Composition deposition apparatus 106 preferably comprises a piezoelectric microdropper or motor-driven microsyringe (both of which can be adapted to deliver picoliter amounts of a nanoparticle-based ink to the substrate), but a microdropper configured to deposit picoliter amounts of a solution-, suspension- or emulsion-phase composition is preferred. In various embodiments, the amounts of the composition to be applied to the circuit region to be repaired may be from 0.001 µL to 100 µL, 0.01 µL to 25 µL, or 0.1 µL to 10 µL. FIG. 3B is a photograph showing a side perspective of an exemplary deposition apparatus nozzle 105, with a droplet of repair composition/ink 111 falling therefrom. The volume of droplet 111 is estimated to be about 15 pl (about 0.015 µl).

The light source may comprise any light source that can be adapted for use in a circuit repair apparatus, but preferably comprises a laser, and more preferably, a laser diode. In even more preferred embodiments, the laser diode emits ultraviolet light of a relatively narrow bandwidth, for example the 100 mW, 830 nm laser diode no. DL7032-001 available commercially from Thorlabs, Inc. (Newton, New Jersey; www.thorlabs.com). Other laser diodes of similar optical power and bandwidth (but different wavelength) are also available from Thorlabs and other laser diode suppliers, and may be suitable for use in the present invention.

Z stage 102 generally comprises a computer-controlled motor and housing. The motor, which is conventional, is configured to move repair apparatus 104 along three perpendicular axes, typically relative to an alignment mark on the substrate undergoing repair. Also generally enclosed within Z stage 102 housing is a container configured to hold the electrically functional material in the liquid phase, and/or a tube or conduit configured to transport the electrically functional material in the liquid phase from the container to the deposition apparatus 106 in repair apparatus 104. Table drive motor and housing 108, chuck 110, table drive axle 112, table 114, and lenses and circuit testing and/or repair devices 116a-116d are all generally conventional.

Figure 4A:
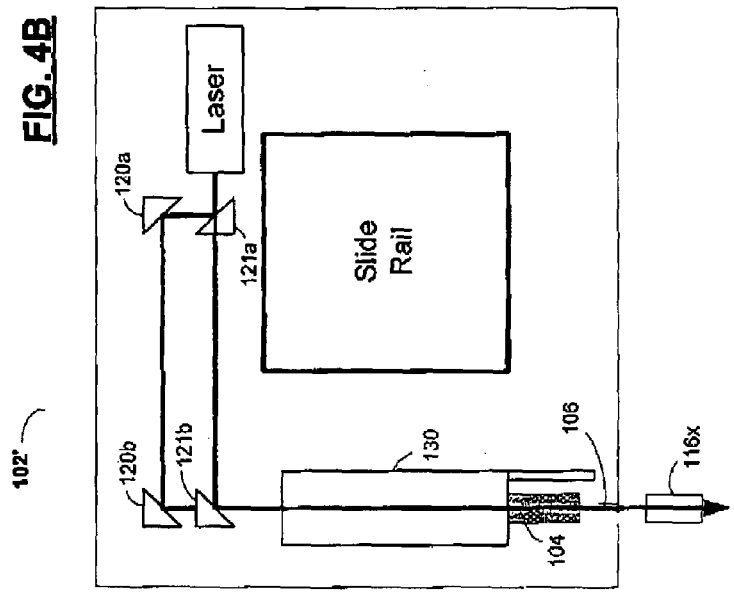
FIG. 4A shows a front view of one embodiment of an exemplary repair stage adapted for the apparatus of FIG. 3A.

FIG. 4A shows a front view of a first exemplary Z stage 102 (i.e., from the side opposite table drive 108 in FIG. 3A). Exemplary Z stage 102 generally comprises first and second lasers (not shown), mirror/reflector/filter system 120-121, mirror/reflector system 122, spot adjuster 124, mirrors 126 and 127, optics cubes/reflector system 128, microscope 130, repair apparatus 104, deposition apparatus 106, local development head 134, and liquid supply system 132. The first and second lasers are generally positioned behind mirror/reflector/filter system 120-121 and mirror/reflector system 122, respectively, and generally transmit light of different intensity maxima. For example, the first laser may have transmission maxima at 1064 nm, 532 nm or at both 355 and 266 nm, any of which may be suitable for use in laser drilling or laser ablation (e.g., of dielectric materials overlying a circuit structure or element to be repaired). The second laser may have a transmission maximum at about 830 nm, for example, which may be suitable for use in laser curing a nanoparticle-based, electrically functional material precursor ink.

Figure 4B:
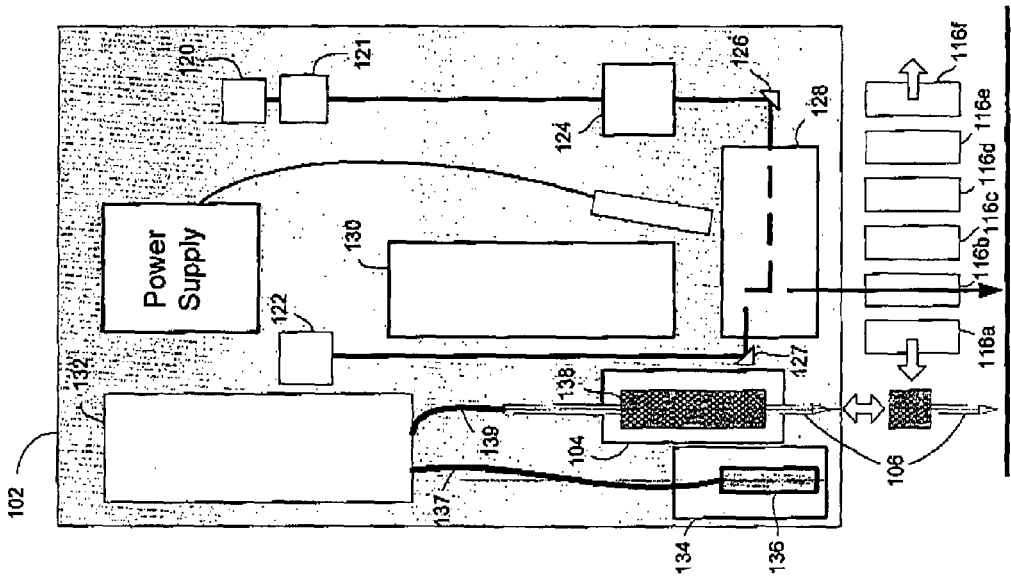
FIG. 4B shows a side view of another exemplary repair stage adapted for the apparatus of FIG. 3A.

Mirror and/or filter system 120-121 which may comprise one or more mirrors and/or one or more filters, is largely conventional, and is shown in greater detail in FIG. 4B. In this context, a mirror may be defined as a device whose function is generally to reflect light along a predetermined path with minimal scattering, depending on the position of the mirror and the angle at which the light is reflected, and a filter may be defined as a device whose function is generally to allow light above and/or below predetermined threshold wavelength(s) to pass through it, and reflect light not above or below the predetermined threshold wavelength(s) as a mirror does. Mirror/reflector system 122 and mirrors 126 and 127 are conventional, and are configured to reflect a maximum amount of light energy towards reflector system 128, with minimal or an immaterial amount of scattering.

Reflector system 128 contains a series of optics cubes, mirrors and or filters, some or all of which may be fixed or which may have adjustable positions, configured to transmit light of a predetermined wavelength (or range or band of wavelengths) towards lens array 116a-116f. Reflector system 128 may also reflect light towards microscope 130, which may focus the light beam as it is transmitted towards lens array 116a-f.

Housed within Z stage 102, but operated separately from the laser systems, are repair apparatus 104 and local development head 134. As described in part above, repair apparatus 104 is generally configured to deliver a predetermined amount of a thin film composition to a region of a circuit to be repaired, generally by laser curing (irradiation). Repair apparatus 104 receives a liquid phase repair composition from liquid supply system 132 via conduit 139. In turn, liquid supply system 132 may comprise one or more reservoirs and (optionally) a supply control device (e.g., a motor-controlled pump or valve, the motor of which is controlled by a conventional computer or workstation operating conventional software for such motor control). Repair apparatus 104 may further comprise a local reservoir 138, which may dispense controlled amounts of the repair composition via deposition apparatus 106 (in which case the amount to be deposited may be controlled by a controlled pump within repair apparatus 104, a motor-controlled pump or valve in liquid supply system 132, or both). Local development head 134 (examples of which are described in greater detail with respect to FIGS. 6A, 7A-B and 8A-C) receives a liquid phase developer from liquid supply system 132 (which generally has separate reservoirs for each repair composition and developer to be used) via conduit 137, and applies the developer to the circuit or substrate being repaired via developer spray head 136. Repair apparatus 104 and local development head 134 may be independently raised and powered with respect to the circuit or substrate being repaired by one or more motors in Z stage 102 adapted to control the position of repair apparatus 104 and local development head 134, but generally, only one of repair apparatus 104 and local development head 134 is lowered towards the circuit or substrate at any given time.

FIG. 4B shows a side view of an alternative, single-laser Z stage embodiment 102'. In this view, it is easier to see mirror/filter system 120-121, which comprises mirrors 120a and 120b and filters 121a and 121b. Also, because Z stage 102' is a single-laser system, microscope 130 can be positioned to directly receive the light beam(s) from mirror/filter system 120-121. Optics within microscope 130 and/or one or more of lenses 116x may allow light of a certain wavelength (or band or range of wavelengths) to pass through to the circuit or substrate to be repaired, while other wavelengths are absorbed, scattered and/or dispersed sufficiently so as not to cause potential damage to structures in the circuit or on the substrate. Of course, other orientations of the laser and mirrors are possible. For example, the laser can be oriented parallel to the microscope, in which case the long, reflective surface of mirrors 120a-121b would face toward the space between the laser and the microscope.

FIGS. 5A-5E show the interaction between parts of repair apparatus 104 and substrate 120 during certain steps of a third embodiment of the present repair method. This embodiment may be appropriate for repair of printed circuit boards or other circuits where the conductive elements can be repaired by directly connecting the disconnected circuit elements (e.g., openings to the disconnected circuit elements are not necessary).

Figure 5A:
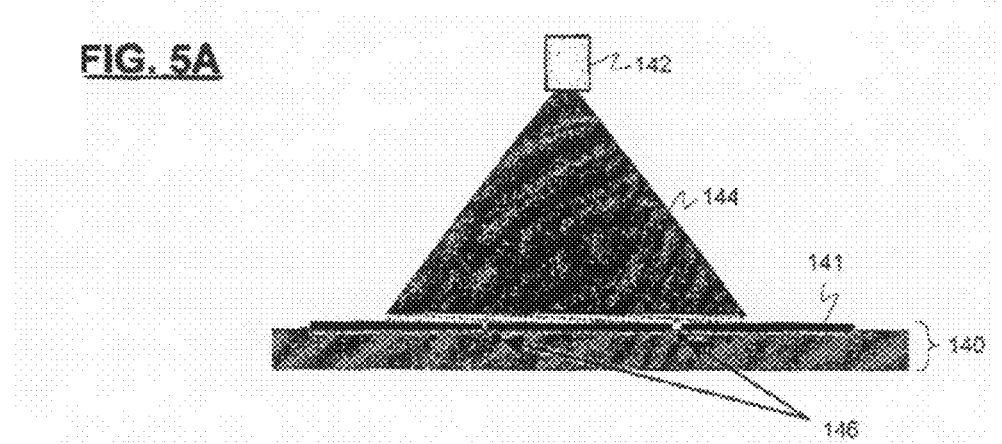
FIGS. 5A-5E show side views of the apparatus-circuit (substrate) interface at various points in the present circuit repair process.

FIG. 5A shows a sprayer head 142 configured to spray substrate 140 with a cleaning agent 144 prior to repair. Sprayer head 142 may be included within the housing of repair apparatus 104, or it may be contained within its own housing (in which case, repair apparatus 104 may comprise multiple housings containing various functional apparatuses, all securely mounted on an adjustable mounting surface that can be moved circumferentially or in two dimensions of a plane substantially parallel to substrate 140). Cleaning agent 144 is generally any conventional cleaning composition used for precleaning circuit surfaces, such as detergent solutions (e.g., DECON 90 or another detergent in deionized water, dilute aqueous KOH, conventional organic base [e.g., amine] or alkaline developers, conventional strippers, ketones [e.g., acetone], alcohols [e.g., isopropanol], etc.), aliphatic organic solvents, aromatic solvents [such as xylenes, toluene, anisole, etc.], etc.).

Figure 5B:
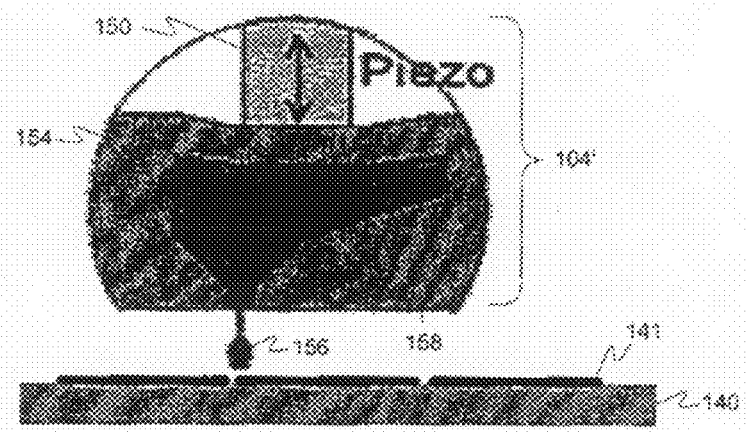

Conventional circuit inspection and/or gap/disconnect detection systems (such as the Arraysaver 550 LCD array repair system, commercially available from Photon Dynamics, Inc., San Jose, Calif., adapted with YAG and YLF lasers, providing 532 and 1064 nm irradiation at 200 mW for etching/drilling holes in surface dielectrics, a microscope viewer and a pattern matching image processor for circuit inspection; the LR-2200 laser trimming system and LR-2300 LCD laser repair system, both commercially available from Hoya, Tokyo, Japan; the Model MRS-6000 and MRS-770 laser repair systems, commercially available from Micronics Japan Co., Ltd., Tokyo, Japan; the SL455H LCD laser repair system from NEC, Tokyo, Japan; and the ESI Model 9820 and Model 9350 laser repair systems from Canon, Inc., Tokyo, Japan) can be used to detect gaps, potential electrical disconnects and/or other areas or locations of anomalous electrical resistance 146 in circuit element 141 on substrate 140 and form holes in circuit passivation to expose locations of the circuit for electrical connection to a repair structure. Other conventional circuit inspection systems that do not necessarily include hole-forming capabilities can also be used in combination with the laser repair apparatus of FIG. 4A, in which at least one laser may be configured to etch or drill holes in passivation. Referring now to FIG. 5B, the gap location information can be input into the computer that controls the Z stage 102 motor to move microdropper 106 into a location directly above gap(s) 146. Piezoelectric device 150 (which could also comprise another conventional device configured to induce a controlled pressure wave through the fluid adjacent to the orifice of the micro drop producing device, such as a MEMS device) compresses microbladder 154 to force a microdrop 156 of repair composition out of reservoir 152. Microdrop 156 generally has a volume on the order of microliter(s) or picoliter(s). Repair composition 160 is supplied to reservoir 152 by conduit 158.

Figure 5C:
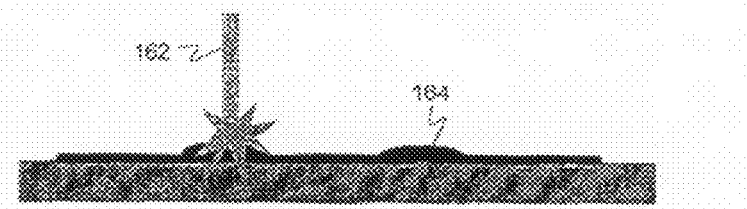

Referring now to FIG. 5C, radiation 162 from a laser (not shown) cross-links or cures the repair composition to form repair structure 164. Repair structure 164, in this case, is shown in somewhat exaggerated form, as the volume of the deposited repair composition decreases dramatically during laser irradiation, and oftentimes will not have a thickness that exceeds that of the circuit elements being repaired. Repair structure 164 also does not include first and second substantially vertical portions. In this embodiment, when the substrate and underlying structures are substantially transparent to the wavelength of radiation, one may irradiate the repair composition through the substrate so that the composition absorbs the radiation selectively in those regions where the composition fills in the gaps and/or spaces in the conductive structure to be repaired.

Figure 5D:
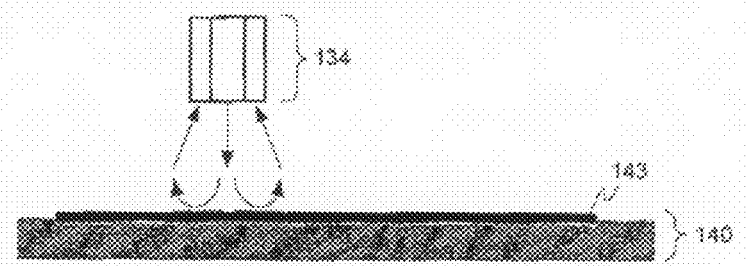
Figure 5E:
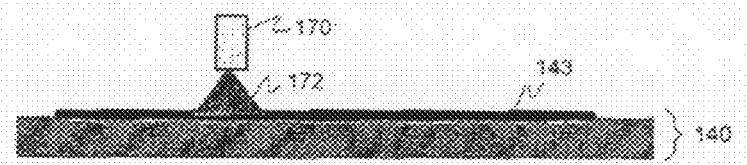

FIG. 5D shows a local development apparatus 166 that is used to clean and/or remove non-irradiated repair composition from the surface of substrate 140 and repaired circuit element 143. Local development apparatus 166 will be described in greater detail below with regard to the exemplary local development apparatus of FIG. 6A. A final rinse and/or cleaning step is shown in FIG. 5E. The final cleaning step is analogous to the preclean of FIG. 5A, but generally, the sprayer head 170 is closer to the substrate 140 and less cleaning agent 172 is used. Alternatively, FIG. 5E may show a final laser curing step, in which the developed repair structure 143 is irradiated with light 172 from a laser 170, which may be the same or different laser as laser 142 in FIG. 5A. In a further alternative embodiment, FIG. 5E may show deposition of an encapsulant 172 from encapsulant deposition apparatus (which may comprise a container configured to hold a liquid encapsulant, and a tube, conduit or spray head configured to deposit a thin film of the liquid encapsulant) onto developed repair structure 143. The deposited encapsulant may be irradiated with curing light from a laser, which may be the same or different laser as laser 142 in FIG. 5A, as described above.

An Exemplary Local Development Apparatus

The invention further relates to an apparatus for locally developing a repaired electrical circuit, generally comprising (1) a developer application apparatus configured to selectively apply a developer to a portion of the repaired electrical circuit including a repair structure, (2) a developer removal apparatus configured to remove the developer and a portion of a composition adjacent the repair structure, the repair structure being formed from the composition. The composition generally forms the repair structure upon irradiation with light from an appropriate light source, such as a laser, and the portion of the composition adjacent the repair structure to be removed comprises a non-irradiated portion of the composition.

In some embodiments, the local development apparatus further comprises a gas movement apparatus configured to provide a gas flow over the portion of the repaired electrical circuit. In one implementation, the gas movement apparatus comprises a vacuum source, a conduit from the local development apparatus to the vacuum source and (optionally) a coolable trap for trapping developer and/or removed "repair" composition. In another implementation, the gas movement apparatus comprises a gas compressor and gas conduit or jacket on the outside of the local development apparatus configured to flow a gas over the developed repair structure area. An air jacket surrounding the local development apparatus (a so-called "gas column" or "air curtain" configuration) is preferred. The local development apparatus preferably further includes both the vacuum source and the gas compressor. Some embodiments further comprise a platform or table configured to support and secure a substrate supporting the repaired electrical circuit, such that the local development apparatus may be placed in a location on or over the repaired electrical circuit.

Figure 6A:
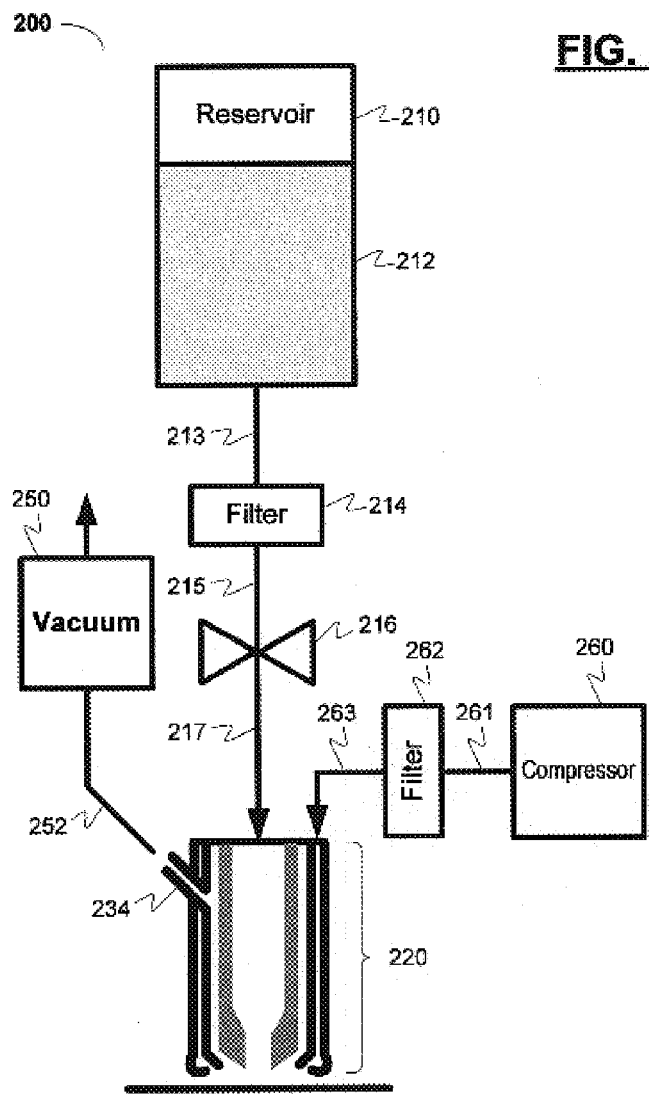
FIG. 6A is a box-level diagram of an apparatus configured to carry out one embodiment of the local development aspect of the present repair process.

FIG. 6A shows an exemplary local development apparatus 200. Apparatus 200 generally comprises developer reservoir 210 containing developer 212, local development interface device 220, vacuum source 250 and compressor 260. Thus, the local development apparatus may further comprise a container configured to hold a developer in which the electrically functional material has a substantially higher solubility than the patterned, electrically functional thin film, and/or a developer tube, conduit or spray head configured to apply the developer to the substrate. Reservoir 210 is in fluid communication with interface device 220 by a series of conduits 213, 215 and 217, with developer filter 214 and microvalve 216 in the fluid communication path. Reservoir 210 may be further adapted to force developer 212 down the conduit 213 by use of pressure, as is conventional in the art; otherwise, gravity should be sufficient.

Figure 6B:
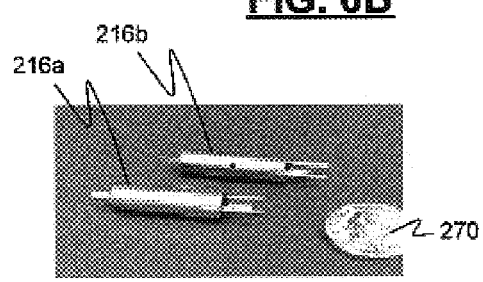
FIG. 6B is a photograph of exemplary valves suitable for use in the present apparatus.

FIG. 6B shows a photograph of two suitable microvalves 216a and 216b (VHS Micro Dispensing Valves, commercially available from Parameter AB, Stockholm, Sweden). To give a sense of size perspective, microvalves 216a and 216b are shown next to a standard dime 270 from U.S. currency. With slight back pressure into conduit 215, microvalve 216 can be made substantially leakproof. Other microvalves, such as back pressure regulators UV-P-465, UV-P-76x and UV-P-79x (available from Unimicro Technologies, Inc., www.unimicrotech.com), are also suitable for use in the present invention.

Vacuum source 250 is conventional (although typically small), and preferably has several different settings to adjust air flow directions and rates within interface device 220 (described in greater detail with respect to FIGS. 7A and 7B below). Thus, the local development apparatus may further comprise a vacuum apparatus located proximate, but not necessarily immediately adjacent, to the developer tube, conduit or spray head, the vacuum apparatus being configured to remove the developer applied to the substrate. In one implementation, vacuum source 250 has a pressure or vacuum adjustment capability configured to provide a sinusoidal function of pressure (or vacuum) versus time. Vacuum source 250 is in gas and/or fluid communication with a nipple 234 on interface device 220 via a conduit 252. Vacuum source 250 may be further configured with a cold finger (not shown) or other coolable trap to collect used developer and unused repair composition, and reduce or prevent damage such substances may cause to vacuum source 250.

Gas compressor 260 is also conventional, and supplies a flow of gas to interface device 220. Gas compressor 260 is in gaseous communication with interface device 220 via conduits 261 and 263. A conventional gas filter 262 may be in the gas communication path to reduce the likelihood of particles on the repaired electrical circuit.

Figure 7A:
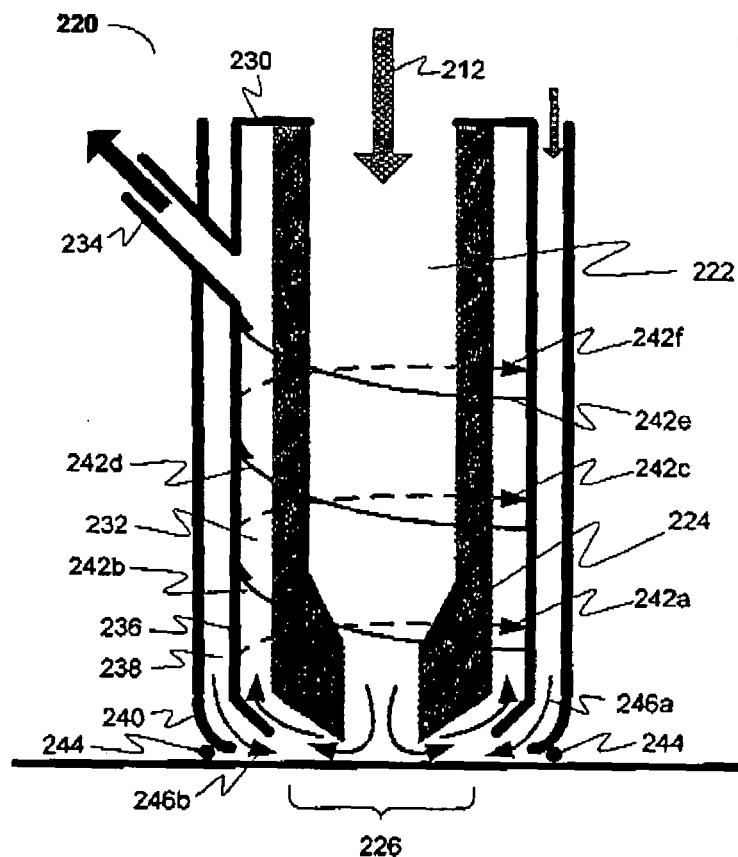
FIGS. 7A-7B are cross-sectional and top views, respectively, of the interface portion of the local development apparatus of FIG. 6A.

FIG. 7A shows a side view of local development interface device 220. Local development interface device 220 generally comprises developer tube or conduit 222, nozzle 224, vacuum chamber 232 surrounded by vacuum sleeve 236, and gas column chamber 238 surrounded by gas column sleeve 240. Developer 212 (either gravity- or pressure-fed) flows through conduit 222 and nozzle 224 onto local development area 226 of a substrate. The shape of nozzle 224 is not limited to that shown in FIG. 7A, and may have a convex, rather than angled, inner surface. Developer 212 flows along local development area 226 radially outward from the opening in nozzle 224 to an entrance to vacuum chamber 232, which is in gaseous and/or fluid communication with a vacuum source via nipple 234. In the design shown, nipple 234 and the vacuum source are configured to create a spiral gas flow within vacuum chamber 232 (see arrows 242a-f). For example, a spiral gas flow can be generated when the vacuum source is configured to generate or provide a regular, sinusoidal pressure variance as a function of time. While not wishing to be bound to any particular theory, it is believed that a spiral gas flow maintains a relatively high flow rate and/or an evenly distributed pressure at the entrance to vacuum chamber 232.

In operation, gas column chamber 238 receives a relatively or substantially constant flow of gas from compressor 260 (see FIG. 6A), and a relatively uniform, constant pressure results at its interface with the repaired electrical circuit. Like vacuum chamber 232, gas column chamber 238 may have a nipple and upper sleeve surface (not shown), and compressor 260 may have adjustable settings (e.g., for flow rate), configured to provide gas column chamber 238 with a substantially even gas flow rate at the bottom (see arrows 246a-b). The gas may be any gas that does not react with or adversely affect the electrical properties of the repaired electrical circuit. Preferred gases include the inert gases described above, although dried and filtered air may also be acceptable under some conditions. In addition (or as an alternative) to gas column chamber 238 and sleeve 240, one may employ a ring 244 at the outer tip of the local development interface device 220 to prevent (i) external gases and/or contaminants from getting into interface device 220, (ii) developer and unused repair composition from escaping outside of interface device 220, (iii) to control more effectively the vacuum in vacuum chamber 232, and/or (iv) to reduce and/or control the gas flow in gas column 238. The ring 244 should be made of a material that is compressible to minimize the likelihood of damaging the repaired electrical circuit, while at the same time, somewhat gas- and/or liquid-impermeable, such as rubber (e.g., VITON™ rubber, commercially available from E. I. Du Pont de Nemours & Co., Wilmington, Del.), or polytetrafluoroethylene (e.g., TEFLON® fluoropolymer, commercially available from E.I. Du Pont de Nemours & Co., Wilmington, Del.).

Figure 7B:
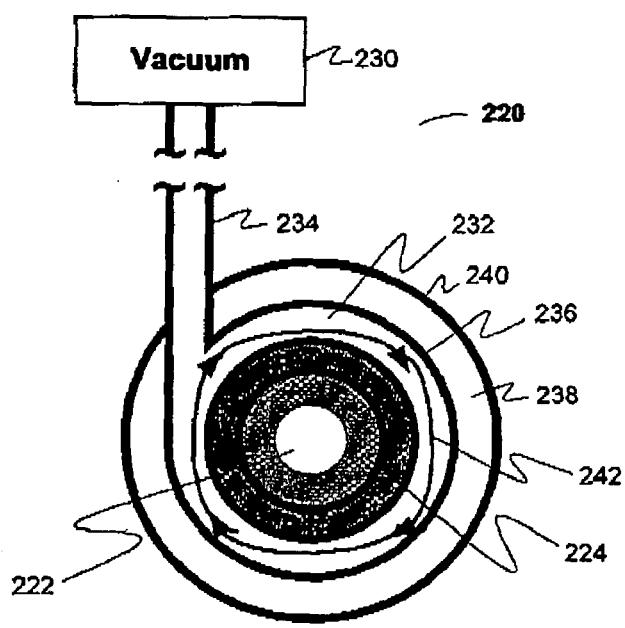

FIG. 7B shows a top-down view into local development interface device 220. As discussed above, developer (not shown) flows through conduit 222 and out nozzle 224 onto the area of a substrate to be developed (the area surrounding the repair structure). The developer flows radially outward from the opening in nozzle 224, along the local development area, to an entrance to vacuum chamber 232, at which point the developer and dissolved repair composition are picked up by spiral gas flow 242 within vacuum chamber. The used developer and removed repair composition are carried out of vacuum chamber 232 through nipple 234. Air curtain 238 serves as a barrier between vacuum chamber 232 and the environment external to the local development area.

The developer may comprise an organic solvent such as toluene, butyl ether, xylene, 3-octanol, terpinol and the like. The developing step may comprise exposing the irradiated and non-irradiated portions of the thin film composition to a solvent (such as an organic solvent) which selectively dissolves portions of the composition in which the nanoparticles are not fused, bound to each other or the substrate, or converted to an electronically functional film. Alternatively, the developing step may comprise exposing the irradiated and non irradiated portions of the thin film composition to a jet of particles. In this embodiment, the particles rapidly convert into a gas, and this phenomenon of rapid formation of gas-phase material from deposited particles enhances the removal of material from the non-irradiated portions of the thin film composition. The particles, in a preferred implementation, comprise dry ice (solid carbon dioxide). In a further alternative, the method further comprises flowing a gas towards or away from the irradiated portion sufficiently to remove one or more by-products of the irradiating step (such as relatively low molecular weight organic molecules or other species formed by thermal or light-induced decomposition of the passivation groups on the nanoparticles).

Thus, the local development apparatus may further comprise a development sub-apparatus, including (i) a fluid delivery system configured to deliver developing solution (or "developer") to the deposited and irradiated thin film; (ii) a vessel for holding the developing solution (which may be part of the fluid delivery system); (iii) a fluid removal apparatus for removing the developing fluid from the substrate; (iv) a developing solution spray jet (which may also be part of the fluid delivery system); (v) a gas outlet configured to provide a flow of air or gas onto or over the deposited and irradiated thin film. Alternatively, the developing sub-apparatus may include a particle jet, preferably a dry ice particle jet, in which case the developing sub-apparatus also preferably includes a vacuum source and an outlet thereto (i.e., from the developing sub-apparatus to the vacuum source).

Figure 8A:
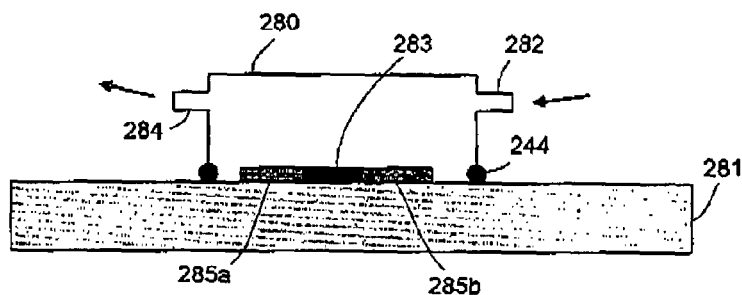
FIG. 8A shows a side view of a relatively simple embodiment of a local development apparatus adapted for use with the repair stage of FIGS. 4A-4B.
Figure 8B:
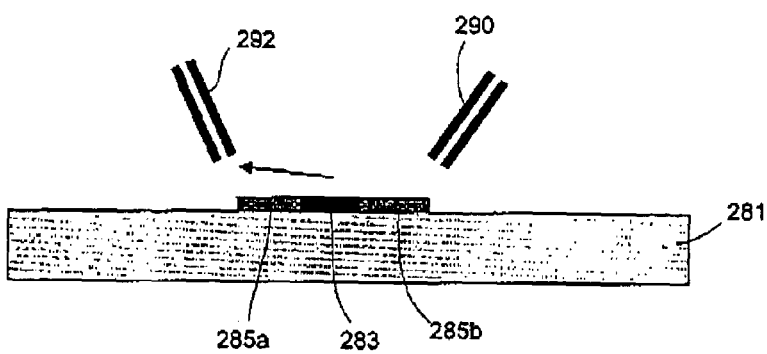
FIG. 8B shows a side view of a simple embodiment of a curing apparatus for use with the present invention.
Figure 8C:
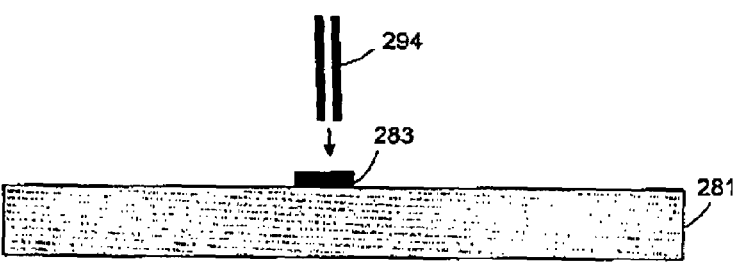
FIG. 8C shows a side view of exemplary post-development thermal treatment apparatus adapted for use with further embodiments of the present invention.

FIGS. 8A-8C show relatively simple embodiments of a local development apparatus (FIG. 8A), a curing apparatus (FIG. 8B), and a post-development thermal treatment apparatus (FIG. 8C). FIG. 8A shows a side view of a local development apparatus 280, comprising developer inlet 282, developer outlet 284, and seal 244. The circuit region on substrate 281 to be repaired includes irradiated thin film composition 283 and non-irradiated composition portions 285a and 285b. Liquid developer can be pumped into developer inlet 282 (as described above for the exemplary local development apparatus of FIG. 6A), and the developer and dissolved non-irradiated portions can be removed via developer outlet 284, e.g., by vacuum removal. After development, a gas flow can be established over the irradiated composition 283 using inlet 282 and outlet 284, generally sufficiently to dry the developed irradiated composition 283. For example, one or more valves can be inserted into the inlet feed line or conduit that enables one to select a developer or a gas to be entered or put into local development apparatus 280.

FIG. 8B shows an exemplary curing apparatus, generally comprising gas outlet 290 and exhaust inlet 292, configured to pass a stream or flow of inert gas (as described above, and which may be heated to a predetermined temperature) over irradiated thin film composition 283 and non-irradiated composition portions 285a and 285b. The gas flow, which may be applied during irradiation, after irradiation, or both, is generally configured to remove by-products of the nanoparticle-binding, -fusing and/or -curing reactions (e.g., removal and/or vaporization of ligands and/or covalently-bound substituents or groups). FIG. 8C shows an even simpler embodiment of a post-development thermal treatment apparatus, generally comprising an outlet 294 configured to pass a heated inert gas over repair structure 283, consistent with the (post)thermal processing steps described above.

In a further embodiment, the present method may further comprise the step of patterning a high surface energy thin film material. In this embodiment, a low surface energy or poorly wetting thin film material is deposited over the circuit region to be repaired (possibly over the entire circuit or device being repaired), then it is patterned to selectively remove portions of the low surface energy material from areas of the circuit corresponding to the region to be repaired, generally to create relatively high surface energy, wetting surfaces onto which the nanoparticle- and/or silane-based thin film composition is subsequently deposited. The surface energy pattern then controls the wetting and flow of the thin film precursor composition, tending to restrict its extent, flow and/or deposition to the high surface energy, wetting areas of the substrate. In this way, the wetting and dewetting areas can provide a relatively high resolution film definition and fluid spreading control to allow for high resolution repair features. This technique may also restrict the flow of ink on the surface to prevent unwanted interactions with other materials. In a preferred implementation (and consistent with the "single tool" advantages of the present invention), the patterning step generally comprises exposing a photopatternable or thermally patternable, low surface energy material (where low implies relative surface energy and or wetting properties relative to underlying or adjacent areas of the substrate) to laser irradiation, and more specifically (i) dispensing a liquid low surface energy thin film precursor onto the region of the circuit to be repaired; (ii) exposing the liquid low high surface energy thin film precursor to laser radiation such that the low surface energy thin film material is fixed to a surface of the region other than an area where the thin film composition for repair of the circuit is to be deposited; and (iii) developing the liquid low surface energy thin film precursor and the low surface energy thin film material to remove the unexposed liquid low surface energy thin film precursor. Examples of suitable low surface energy materials include conventional polyimides, polydimethylsiloxanes and conventional fluorinated polymers (such as TEFLON AF™ fluoropolymer, commercially available from E.I. Du Pont de Nemours & Co., Wilmington, Del.) as well as alkyl group-exposing, surface-assembled monolayers (such as hexamethyldisilazane), fluorinatated self-assembled monolayers or other surfactants. If desired, one can remove the low surface energy material after irradiation of the nanoparticle- and/or silane-based thin film composition.

In furtherance of the "single tool" advantages of the present invention, and in order to produce inspected and repaired circuits from a single tool, the present apparatus may further comprise an integrated circuit testing apparatus (such as any of the commercially available circuit testing tools and/or equipment described herein) and/or an integrated circuit fabrication apparatus (which generally comprises the same elements, components, devices and/or sub-apparatuses as the present repair apparatus, but which may include different nanoparticles, inks, lasers and/or developers, depending on the nature of the integrated circuit structure being fabricated).

Implementation Example

FIG. 9 shows a mask design 300 for testing the present invention. Four test circuits 320, 322, 324 and 326 are shown, each having identical components. For example, test circuit 320 comprises pads 302a and 304a, first and second bus or conductor portions 306a and 308a, and gap (or electrical disconnection) 314a. Test circuits 320, 322, 324 and 326 differ from each other primarily in the width of their respective conductors (respectively, 5, 7, 9 and 11 µm in width).

A repair composition containing silver nanoparticles suspended in butyl ether (providing a total silver weight percentage of 30%) was prepared. The composition further included Ag nanoparticles or other organic solvent and a Pd organometallic precursor to enhance morphology and adhesion. (Similar compositions in other organic solvents providing a Ag mass loading of between 10-40% by weight have been successfully used.) Other solvents suitable for use in this composition include toluene, xylene, mesitylene, cyclohexane, cyclohexane derivatives, terpinols, pinenes, higher alcohols, or simple alkanes such as decane. Holes were conventionally wet etched into the oxide passivation overlying the ends of test circuit conductors 306a-d and 308a-d near gaps 314a-d using a conventional BOE/HF mixture. Conventional dry etching has also been demonstrated to be effective at opening holes of sufficient width and controlled depth for the circuit repair process described herein. The repair composition was deposited over the holes and across the gaps by conventional spin coating to form a uniform precursor film of from 0.5 to 2 microns thickness. A focused laser beam from a conventional laser diode (830 nm, 150 mW, 5 µm beam width) was then used to cure the deposited repair composition in a straight line along the first and second conductor portions 306a-d and 308a-d. After local development using the exemplary apparatus of FIGS. 6A-7B, the test circuits were probed for conductivity/resistance measurements. The pad-to-pad resistance, including the conductors and the repair structures across gaps 314a-d (which have an x-x' distance of 150 microns), after repair was less than 200 ohms in each of the circuits 320-326.

Figure 10:
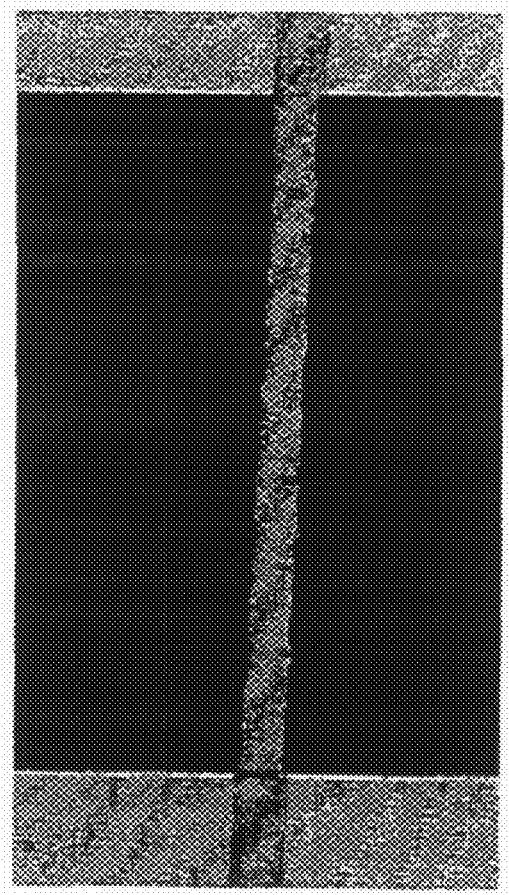
FIG. 10 is a photograph of a repaired test circuit produced by the present invention.

FIG. 10 is a photograph showing a top view of an exemplary 10 micron wide repair structures formed across a 150 micron gap on test structures similar to the circuits 320-326. As can be seen, the repair structure uniformity is quite good, and circuits can be successfully repaired using the invention. As stated above, in typical cases, the resistance of a repaired test circuit is <200 ohms, including contacts to the Al pads. Resistances of less than ~300 ohms are typically sufficient to produce repaired interconnect lines on LCD panels, with no noticeable difference to unrepaired lines. These exemplary repair structures pass a conventional "Scotch tape" adhesion test without post development annealing. For repair structures having a thickness of ≦about 60 nm, adhesion was good as converted and developed.

However, thicker repair lines may require post development annealing to ensure good adhesion. Improved adhesion of thicker lines (about 70 nm) using post development laser treatment has been demonstrated, and this post-development laser annealing showed resistivity improvements equivalent to the curing/RTA treatment described above in paragraphs [0041]-[0044]. Improved adhesion of much thicker (e.g., about 200 nm) lines has been demonstrated with RTA treatment. While RTA itself is certainly suitable for the present circuit repair technique, it is more economically advantageous to employ local heating, for example using one of the apparatuses in FIGS. 8B-8C. The RTA results demonstrate the feasibility of local heating via a heated gas jet and/or laser annealing.

CONCLUSION/SUMMARY

Thus, the present invention provides a thin film structure and a composition, ink method and apparatus for repairing electrical circuits. The present composition and method can also be used for other methods and thin film structures, such as forming electrical circuit structures (e.g., resistors, inductors, etc.), largely in accordance with known techniques. In addition, the present invention is also useful for rewiring electrically severed fuses, rewriting read only memory cells, etc. Furthermore, the invention is useful for forming multi-layered repair structures, such as a conductive repair structure as described above with an insulator layer thereon, formed by a similar method (but using an insulator-based nanoparticle composition).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of repairing a circuit, comprising the steps of:
    a) depositing a thin film composition comprising nanoparticles of at least one electrically functional material on or over a region of said circuit to be repaired such that said thin film composition contacts first and second elements of said circuit;
    b) irradiating at least a portion of the thin film composition with a wavelength of light for a length of time and at an intensity sufficient to convert said nanoparticles to an electronically functional film, fuse said nanoparticles or bind said nanoparticles to each other; and
    c) locally rinsing said irradiated thin film with a developer to remove non-irradiated portions or portions adjacent to the irradiated portion of the composition.

2. The method of claim 1, wherein said length of time is sufficient to convert said thin film composition into said electronically functional thin film.

3. The method of claim 1, wherein a source of said light comprises a laser.

4. The method of claim 1, wherein said nanoparticles comprise metal nanoparticles.

5. The method of claim 1, wherein said composition further comprises a sensitizer configured to selectively absorb said wavelength of said light.

6. The method of claim 5, wherein said light has a bandwidth of 40 nm or less.

7. The method of claim 1, wherein said light consists essentially of infrared light with an emission maximum of from about 800 to about 850 nm.

8. The method of claim 1, wherein said light has properties and said wavelength has a penetration depth such that illumination intensity at an interface between said thin film composition and said first and second elements of said circuit is sufficiently high to convert said nanoparticles near the interface to an electronically functional film.

9. The method of claim 8, wherein said intensity at the interface is >25% of an incident intensity.

10. The method of claim 1, wherein at least one circuit component absorbs said wavelength of light at an efficiency sufficiently low to prevent detrimental effects to said component or an adjacent component.

11. The method of claim 1, wherein said nanoparticles comprise a precursor to a semiconducting film.

12. The method of claim 1, wherein said nanoparticles comprise a precursor to a dielectric film.

13. The method of claim 1, further comprising, prior to said depositing step, the step of exposing the first and second circuit elements.

14. The method of claim 13, wherein said exposing step comprises laser ablation.

15. The method of claim 13, further comprising, after said exposing step and prior to said depositing step, the step of preparing a surface of said first and second circuit elements for said depositing.

16. The method of claim 15, wherein said preparing step comprises cleaning said surface of said first and second circuit elements.

17. The method of claim 1, further comprising covering a repair area formed by said irradiated thin film composition with a coating, passivation or capping material.

18. The method of claim 17, wherein said covering step comprises dispensing a liquid precursor onto said repair area, said liquid precursor forming said coating, passivation or capping material upon further treatment or processing.

19. The method of claim 18, wherein said covering step further comprises laser curing said liquid precursor.

20. The method of claim 18, wherein said liquid precursor comprises a polyimide, spin on glass, polysesquiloxane, or PDMS.

21. The method of claim 20, wherein said liquid precursor comprises said polyimide and a thermal sensitizer.

22. The method of claim 1, further comprising flowing a gas towards or away from the irradiated portion sufficiently to remove one or more by-products of the irradiating step.

23. The method of claim 1, further comprising, prior to said irradiating step, the steps of placing said substrate into a chamber, evacuating said chamber, and passing an inert and/or reducing gas into said chamber.

24. The method of claim 1, further comprising heating said irradiated portion of said thin film composition.

25. The method of claim 24, wherein said heating comprises flowing heated gas over said irradiated portion of said thin film composition.

26. The method of claim 24, further comprising the step of post-thermal processing the irradiated portion of said thin film composition.

27. The method of claim 26, wherein said post thermal processing comprises exposing said irradiated portion of said thin film composition to radiation.

28. The method of claim 27, wherein said post thermal processing comprises locally exposing said irradiated portion of said thin film composition to radiation.

29. The method of claim 27, wherein said radiation is provided by a laser.

30. The method of claim 27, wherein said radiation has a wavelength of less than 500 nanometers.

31. The method of claim 27, wherein said post thermal processing is conducted sufficiently to improve a conductivity of the irradiated portion of said thin film composition.

32. The method of claim 27, wherein said post thermal processing is conducted sufficiently to improve adhesion of the irradiated portion of said thin film composition to an underlying or adjacent layer.

33. The method of claim 27, wherein said post thermal processing is conducted sufficiently to relax a stress and/or improve a morphology or profile of said irradiated portion of said thin film composition.

34. The method of claim 1, further comprising examining or testing said circuit to find and/or locate said region to be repaired.

35. The method of claim 34, further comprising fabricating a circuit or circuit element prior to said examining or testing step.

36. The method of claim 35, wherein each of said fabricating, said examining or testing, said depositing and said irradiating steps are performed by a single tool.

37. A method of repairing a circuit, comprising the steps of:
  a) depositing a thin film composition comprising nanoparticles of at least one electrically functional material on or over a region of said circuit to be repaired such that said thin film composition contacts first and second elements of said circuit;
  b) irradiating at least a portion of the thin film composition with a wavelength of light for a length of time and at an intensity sufficient to convert said nanoparticles to an electronically functional film, fuse said nanoparticles or bind said nanoparticles to each other; and
  c) exposing the irradiated and non-irradiated portions of the composition to a solvent which dissolves portions of the composition in which said nanoparticles are not fused, bound to each other or the substrate, or converted to said electronically functional film.

38. The method of claim 37, wherein said length of time is sufficient to convert said thin film composition into said electronically functional thin film.

39. The method of claim 37, wherein a source of said light comprises a laser.

40. The method of claim 37, wherein said nanoparticles comprise metal nanoparticles.

41. The method of claim 37, wherein said light consists essentially of infrared light with an emission maximum of from about 800 to about 850 nm.

42. The method of claim 37, wherein said nanoparticles comprise a precursor to a semiconducting film.

43. The method of claim 37, wherein said nanoparticles comprise a precursor to a dielectric film.

44. The method of claim 37, further comprising, prior to said depositing step, the step of exposing the first and second circuit elements.

45. The method of claim 37, further comprising covering a repair area formed by said irradiated thin film composition with a coating, passivation or capping material.

46. The method of claim 37, wherein said step of exposing the irradiated and non-irradiated portions of the composition to said solvent comprises locally rinsing said irradiated thin film with a developer.

47. The method of claim 46, wherein said developer comprises an organic solvent.

48. The method of claim 47, wherein said developer comprises a member selected from the group consisting of toluene, butyl ether, xylene, 3-octanol and terpinol.

49. The method of claim 37, further comprising, prior to said irradiating step, the steps of placing said substrate into a chamber, evacuating said chamber, and passing an inert and/or reducing gas into said chamber.

50. The method of claim 37, further comprising heating said irradiated portion of said thin film composition.

51. The method of claim 50, further comprising post thermal processing said irradiated portion of said thin film composition to sufficient radiation having a wavelength of less than 500 nanometers to improve a conductivity of the irradiated portion of said thin film composition, improve adhesion of the irradiated portion of said thin film composition to an underlying or adjacent layer, and/or relax a stress and/or improve a morphology or profile of said irradiated portion of said thin film composition.

52. The method of claim 37, further comprising examining or testing said circuit to find and/or locate said region to be repaired.

53. The method of claim 52, wherein each of said examining or testing, said depositing and said irradiating steps are performed by a single tool.

54. A method of repairing a circuit, comprising the steps of:
  a) depositing a thin film composition comprising nanoparticles of at least one electrically functional material on or over a region of said circuit to be repaired such that said thin film composition contacts first and second elements of said circuit;
  b) irradiating at least a portion of the thin film composition with a wavelength of light for a length of time and at an intensity sufficient to convert said nanoparticles to an electronically functional film, fuse said nanoparticles or bind said nanoparticles to each other; and
  c) exposing the irradiated and non irradiated portions of the composition to a jet of particles.

55. The method of claim 54, wherein the particles rapidly convert into a gas, enhancing the removal of material from the non-irradiated portions of the composition.

56. The method of claim 54, wherein said jet of particles comprises dry ice (solid carbon dioxide).

57. The method of claim 54, wherein said length of time is sufficient to convert said thin film composition into said electronically functional thin film.

58. The method of claim 54, wherein said nanoparticles comprise metal nanoparticles.

59. The method of claim 54, wherein said nanoparticles comprise a precursor to a semiconducting film.

60. The method of claim 54, wherein said nanoparticles comprise a precursor to a dielectric film.

61. The method of claim 54, further comprising, prior to said depositing step, the step of exposing the first and second circuit elements.

62. The method of claim 54, further comprising covering a repair area formed by said irradiated thin film composition with a coating, passivation or capping material.

63. The method of claim 62, further comprising post thermal processing said irradiated portion of said thin film composition to sufficient radiation having a wavelength of less than 500 nanometers to improve a conductivity of the irradiated portion of said thin film composition, improve adhesion of the irradiated portion of said in film composition to an underlying or adjacent layer, and/or relax a stress and/or improve a morphology or profile of said irradiated portion of said thin film composition.

64. The method of claim 54, further comprising, prior to said irradiating step, the steps of placing said substrate into a chamber, evacuating said chamber, and passing an inert and/or reducing gas into said chamber.

65. The method of claim 54, further comprising heating said irradiated portion of said thin film composition.

66. The method of claim 54, further comprising examining or testing said circuit to find and/or locate said region to be repaired.

67. The method of claim 66, wherein each of said examining or testing, said depositing and said irradiating steps are performed by a single tool.

68. A method of repairing a circuit, comprising the steps of:
  a) depositing a thin film composition comprising a solution precursor to a semiconducting material on or over a region of said circuit to be repaired such that said thin film composition contacts at least one element of said circuit; and
  b) irradiating at least a portion of the thin film composition with a wavelength of light for a length of time and at an intensity sufficient to convert said solution precursor to an electronically functional film, convert said solution precursor to a corresponding oxide and/or nitride, or make said solution precursor insoluble in a subsequent developing step, thereby adding a new semiconducting element to the circuit.

69. The method of claim 68, further comprising the step of developing said irradiated thin film to remove non-irradiated portions or portions adjacent to the irradiated portion of the composition.

70. The method of claim 69, wherein said developing step comprises locally rinsing said irradiated thin film with a developer.

71. The method of claim 70, wherein said developer comprises an organic solvent.

72. The method of claim 71, wherein said developer comprises a member selected from the group consisting of toluene, butyl ether, xylene, 3-octanol and terpinol.

73. The method of claim 68, wherein the solution precursor includes a silane.

74. A method of repairing a circuit, comprising the steps of:
  a) depositing a thin film composition comprising a solution precursor to a semiconducting material on or over a region of said circuit to be repaired such that said thin film composition contacts at least one element of said circuit;
  b) irradiating at least a portion of the thin film composition with a wavelength of light for a length of time and at an intensity sufficient to convert said solution precursor to an electronically functional film, convert said solution precursor to a corresponding oxide and/or nitride, or make said solution precursor insoluble in a subsequent developing step; and
  c) oxidizing or nitriding the deposited thin film composition sufficiently to produce an insulating feature.

75. The method of claim 74, wherein the method repairs a circuit by adding a new semiconducting element to the circuit.

76. The method of claim 74, wherein the solution precursor includes a silane.

77. A method of repairing a circuit, comprising the steps of:
  a) dispensing a liquid low surface energy thin film precursor onto a region of said circuit to be repaired;
  b) exposing the liquid low surface energy thin film precursor to laser radiation such that the low surface energy thin film material is fixed to a surface of said region other than an area where a thin film composition comprising nanoparticles of at least one electrically functional material is to be deposited;
  c) developing the liquid low surface energy thin film precursor and the high surface energy thin film material to remove the unexposed liquid high surface energy thin film precursor;
  d) depositing the thin film composition on or over the region of said circuit to be repaired such that said thin film composition contacts first and second elements of said circuit; and
  e) converting said nanoparticles to an electronically functional film.

78. The method of claim 77, wherein converting said nanoparticles comprises irradiating the thin film composition.

79. The method of claim 78, wherein said nanoparticles are irradiated with a wavelength and/or intensity of light generally sufficient to improve adhesion of the electronically functional thin film to an underlying or adjacent layer.

80. The method of claim 77, wherein converting said nanoparticles comprises heating the thin film composition.

* * * * *